US012261196B2

(12) United States Patent
Chou et al.

(10) Patent No.: US 12,261,196 B2
(45) Date of Patent: Mar. 25, 2025

(54) METAL-INSULATOR-METAL DEVICE CAPACITANCE ENHANCEMENT

(71) Applicant: Taiwan Semiconductor Manufacturing Company, Ltd., Hsinchu (TW)

(72) Inventors: Lu-Sheng Chou, Tainan (TW); Hsuan-Han Tseng, Tainan (TW); Chun-Yuan Chen, Tainan (TW); Hsiao-Hui Tseng, Tainan (TW); Ching-Chun Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 411 days.

(21) Appl. No.: 17/703,150

(22) Filed: Mar. 24, 2022

(65) Prior Publication Data

US 2023/0307492 A1    Sep. 28, 2023

(51) Int. Cl.
*H01L 23/522* (2006.01)
*H01L 21/768* (2006.01)
*H01L 23/528* (2006.01)
*H01L 49/02* (2006.01)

(52) U.S. Cl.
CPC ........ *H01L 28/60* (2013.01); *H01L 21/76877* (2013.01); *H01L 23/5223* (2013.01); *H01L 23/5226* (2013.01); *H01L 23/5283* (2013.01)

(58) Field of Classification Search
CPC ........... H01L 21/76877; H01L 23/5223; H01L 23/5226; H01L 23/5283; H01L 28/60
See application file for complete search history.

(56) References Cited

U.S. PATENT DOCUMENTS

| | | | |
|---|---|---|---|
| 6,630,380 B1 | 10/2003 | Cheng et al. | |
| 9,647,057 B2 * | 5/2017 | Voiron | H01L 27/0805 |
| 11,404,534 B2 * | 8/2022 | Kao | H01L 27/0694 |
| 11,640,971 B2 * | 5/2023 | Chyi | H01L 21/76877 |
| | | | 257/532 |
| 2008/0128859 A1 | 6/2008 | Chen et al. | |
| 2010/0065944 A1 | 3/2010 | Tu et al. | |
| 2015/0140774 A1 | 5/2015 | Pai et al. | |
| 2015/0145103 A1 * | 5/2015 | Chou | H01L 21/822 |
| | | | 438/387 |

(Continued)

*Primary Examiner* — Mark W Tornow
(74) *Attorney, Agent, or Firm* — Eschweiler & Potashnik, LLC

(57) ABSTRACT

In some embodiments, the present application provides an integrated chip (IC). The IC includes a metal-insulator-metal (MIM) device disposed over a substrate. The MIM device includes a plurality of conductive plates that are spaced from one another. The MIM device further includes a first conductive plug structure that is electrically coupled to a first conductive plate and to a third conductive plate of the plurality of conductive plates. A first plurality of insulative segments electrically isolate a second conductive plate and a fourth conductive plate from the first conductive plug structure. The MIM device further includes a second conductive plug structure that is electrically coupled to the second conductive plate and to the fourth conductive plate of the plurality of conductive plates. A second plurality of insulative segments electrically isolate the first conductive plate and the third conductive plate from the second conductive plug structure.

20 Claims, 23 Drawing Sheets

(56) References Cited

U.S. PATENT DOCUMENTS

2016/0020267 A1* 1/2016 Lin .................. H01L 29/945
                                                    257/532
2020/0098855 A1* 3/2020 Kuo .................. H01L 28/91

\* cited by examiner

METAL-INSULATOR-METAL DEVICE CAPACITANCE ENHANCEMENT

BACKGROUND

Integrated circuits (ICs) are formed on semiconductor dies comprising millions or billions of transistor devices. The transistor devices are configured to act as switches and/or to produce power gains so as to enable logical functionality. ICs also comprise passive devices used to control gains, time constants, and other IC characteristics. One type of passive device is a metal-insulator-metal (MIM) capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
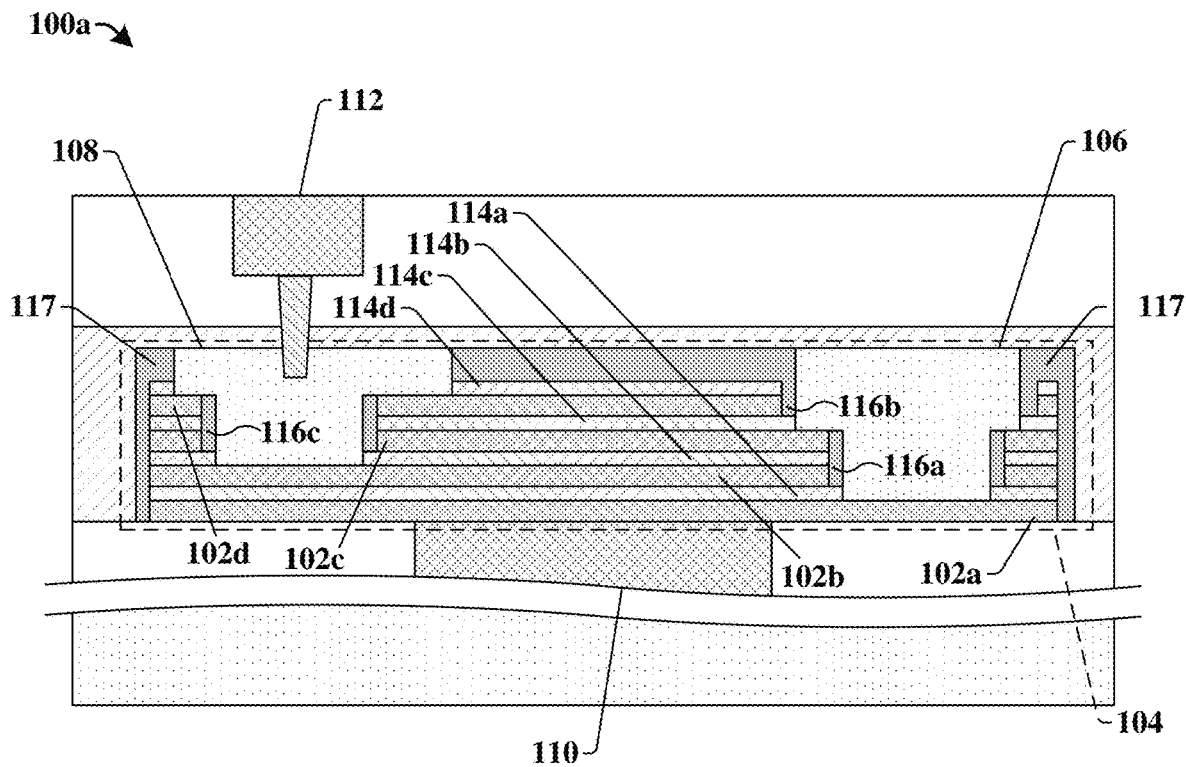
FIG. 1A illustrates a cross-sectional view of some embodiments of an integrated chip (IC) having a metal-insulator-metal (MIM) device with a plurality of conductive plates and conductive plug structures selectively coupled to the plurality of conductive plates.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a metal-insulator-metal (MIM) device (e.g., a MIM capacitor) comprises a bottom metal plate, a top metal plate over the bottom metal plate, and a capacitor insulator structure between the bottom and top metal plates. However, as integrated chips (ICs) are continually scaled down (e.g., pixel sizes are reduced), typical MIM devices are failing to provide the performance (e.g., capacitance per unit area) required for specific applications, such as image sensing technologies. As image sensors and many other technologies have use for capacitors with a combination of high capacitance and low pixel sizes, an MIM device having improved performance (e.g., increased capacitance for a given layout area) without sacrificing reliable connections is desired.

Various embodiments of the present disclosure are directed toward a MIM device (e.g., MIM capacitor) with improved performance. The MIM device comprises a first conductive plate, a second conductive plate, a third conductive plate, and a fourth conductive plate. A first capacitor insulator structure is disposed between the first conductive plate and the second conductive plate. Second and third capacitor insulator structures are similarly disposed between both the second conductive plate and the third conductive plate and the third conductive plate and the fourth conductive plate, respectively. The first conductive plate and the third conductive plate are both electrically coupled to a first conductive plug structure (e.g., metal contact), while the second conductive plate and the fourth conductive plate are electrically isolated from the first conductive plug structure by insulative segments lining sidewalls of the first conductive plug structure. The second conductive plate and the fourth conductive plate are both electrically coupled to a second conductive plug structure, while the first conductive plate and the third conductive plate are electrically isolated from the second conductive plug structure by insulative segments lining sidewalls of the second conductive plug structure. The plurality of conductive plates act as multiple capacitors within the MIM device. As such, for a given footprint, the MIM device of the present disclosure may have a greater capacitance than a typical MIM device (e.g., due the MIM device of the present disclosure having an overall capacitance that is equal to a sum of the capacitance between the first conductive plate and the second conductive plate, the capacitance between the second conductive plate and the third conductive plate, and the capacitance between the third conductive plate and the fourth conductive plate). Accordingly, the MIM device of the present disclosure may be utilized in some applications that typical MIM devices are not suitable (e.g., image sensors and ICs with small pixel sizes).

FIG. 1A illustrates a cross-sectional view 100a of some embodiments of an integrated chip (IC) having a metal-insulator-metal (MIM) device 104 with a plurality of conductive plates 102a-102d and conductive plug structures 106-108 selectively coupled to the plurality of conductive plates 102a-102d.

As shown in the cross-sectional view 100a of FIG. 1A, the integrated chip comprises the plurality of conductive plates 102a-102d, which are connected together to form an MIM device 104. In some embodiments, the plurality of conductive plates 102a-102d comprise a first conductive plate 102a and a third conductive plate 102c electrically coupled through a first conductive plug structure 106. The plurality of conductive plates 102a-102d may further comprise a second conductive plate 102b and a fourth conductive plate 102d electrically coupled through a second conductive plug structure 108. Both the first conductive plug structure 106 and the second conductive plug structure 108 are electrically coupled to other devices or an interconnect structure through a first electrode 110 and a second electrode 112, respectively.

The first conductive plug structure 106 and the second conductive plug structure 108 are electrically coupled to the plurality of conductive plates 102a-102d through faces that contact the first conductive plug structure 106 and the second conductive plug structure 108. These surfaces ensure a good connection to the plurality of conductive plates 102a-102d which enhances a reliability of the MIM device 104. The first conductive plug structure 106 and the second conductive plug structure 108 are electrically isolated from one or more of the plurality of conductive plates 102a-102d by insulative segments 116a-116c. An insulative barrier 117 further extends along outer sidewalls of the conductive plates 102a-102d on one edge of the MIM device 104. In some embodiments, the insulative segments 116a-116c comprise first insulative segments 116a and second insulative segments 116b, which are configured to isolate the first conductive plug structure 106 from the second conductive plate 102b and the fourth conductive plate 102d, respectively. In some embodiments, the insulative segments 116a-116c further comprise third insulative segments 116c configured to isolate the second conductive plug structure 108 from the third conductive plate 102c. These insulative segments 116a-116c enable the MIM device 104 to act as a plurality of capacitors connected in parallel. The combined capacitance of the plurality of capacitors is greater than the capacitance provided by the individual pairs of conductive plates.

Figure 1B:
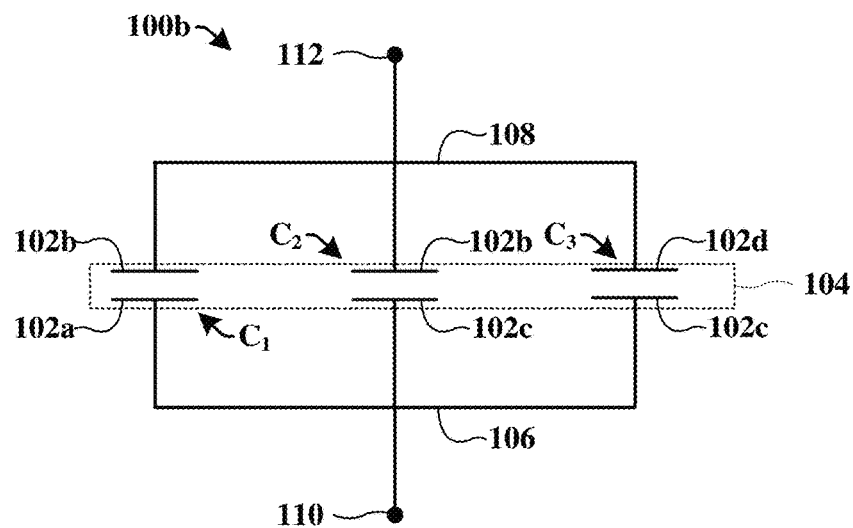
FIG. 1B illustrates some embodiments of a circuit diagram corresponding to the MIM capacitor of FIG. 1A.

FIG. 1B illustrates a circuit diagram 100b corresponding to some embodiments of the metal-insulator-metal (MIM) device of FIG. 1A.

As shown in the circuit diagram 100b of FIG. 1B, the plurality of capacitors comprises a first capacitor $C_1$, a second capacitor $C_2$, and a third capacitor $C_3$. The plurality of capacitors are each a combination of the plurality of conductive plates 102a-102d and the capacitor insulator structures 114a-114d that the MIM device 104 is composed of. The first capacitor $C_1$ corresponds to the first conductive plate 102a and the second conductive plate 102b. The second capacitor $C_2$ corresponds to the second conductive plate 102b and the third conductive plate 102c. The third capacitor $C_3$ corresponds to the third conductive plate 102c and the fourth conductive plate 102d. The first capacitor $C_1$, the second capacitor $C_2$, and the third capacitor $C_3$ are connected in parallel. The first capacitor $C_1$, the second capacitor $C_2$, and the third capacitor $C_3$ are connected in parallel due to each of a first group of conductive plates of the plurality of conductive plates 102a-102d being electrically coupled to the first conductive plug structure 106, and due to each of a second group of conductive plates of the plurality of conductive plates 102a-102d being electrically coupled to a second conductive plug structure 108. More specifically, the first group of conductive plates includes the first conductive plate 102a and the third conductive plate 102c, which are electrically coupled together via the first conductive plug structure 106. Further, the first conductive plate 102a is electrically coupled to a first electrode 110 of a first interconnect structure. Moreover, the second group of conductive plates comprise the second conductive plate 102b and the fourth conductive plate 102d, which are electrically coupled together via the second conductive plug structure 108, which is electrically coupled to a second electrode 112 of a second interconnect structure.

Therefore, for a given footprint, the MIM device 104 may have a greater capacitance than a typical MIM device (e.g., due the MIM device 104 having an overall capacitance that is equal to the sum of a capacitance of the first capacitor $C_1$, a capacitance of the second capacitor $C_2$, and a capacitance of the third capacitance $C_3$). The greater capacitance is enabled by having a first conductive plug structure 106 and a second conductive plug structure 108 that are electrically coupled to their respective conductive plates 102a-102d and are electrically isolated from one another by insulative segments, 116a-116c. Thus, the MIM device 104 may have improved performance (e.g., increased capacitance for a given layout area) over the typical MIM device while also maintaining the reliability of the device. Accordingly, the MIM device 104 may be utilized in some applications for which typical MIM devices are not suitable (e.g., image sensors and ICs with small pixel sizes).

Figure 2:
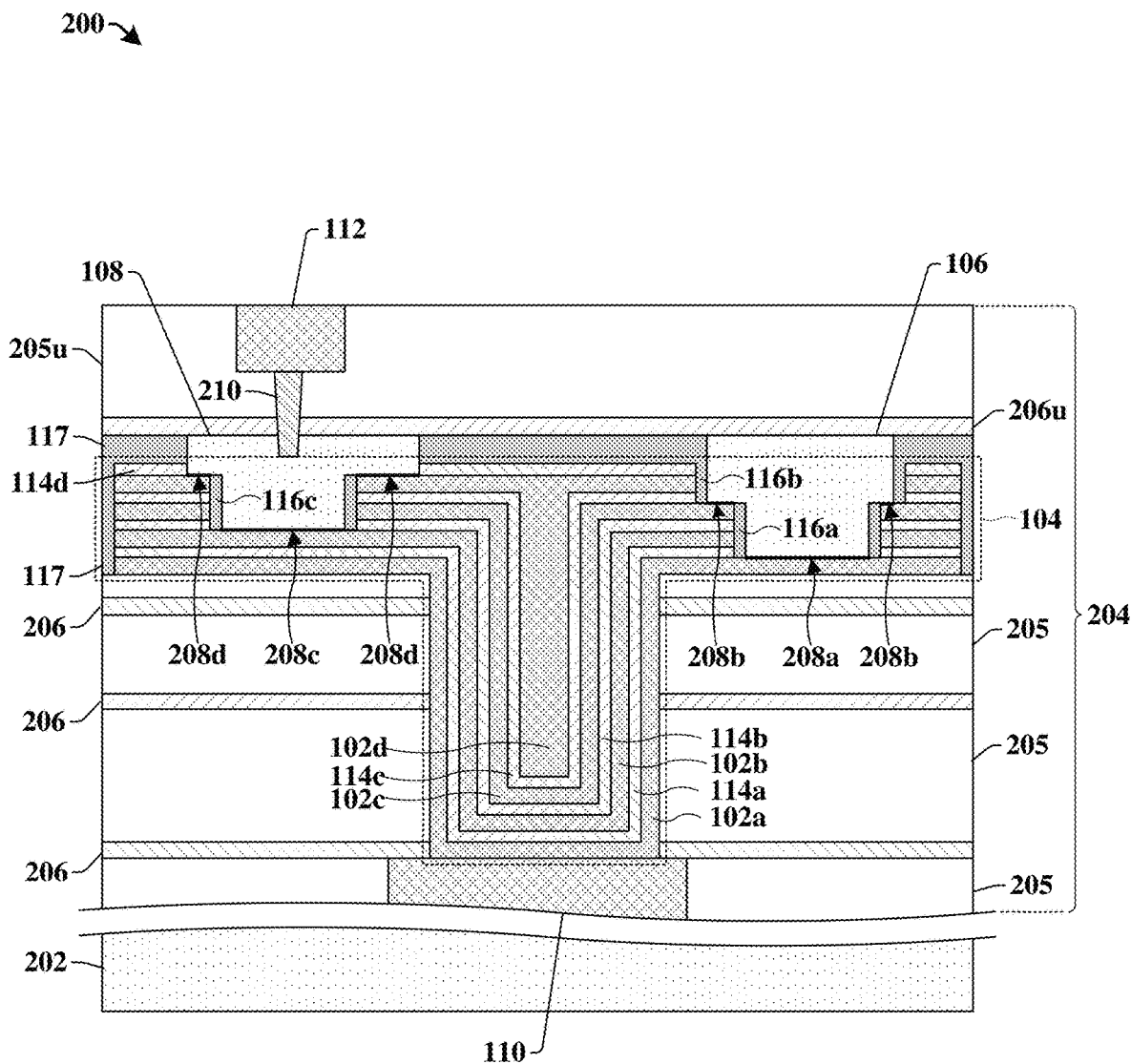
FIG. 2 illustrates a cross-sectional view of some embodiments of an integrated chip having a MIM device with a plurality of conductive plates and conductive plug structures selectively coupled to the plurality of conductive plates.

One possible embodiment is shown in the cross-sectional view 200 of FIG. 2. In FIG. 2, the MIM device 104 overlies a substrate 202. The MIM device 104 comprises the plurality of conductive plates 102a-102d and a plurality of capacitor insulator structures 114a-114d. In some embodiments, the plurality of conductive plates 102a-102d may respectively comprise sidewalls extending outward from a lower surface of the conductive plates 102a-102d. For example, in some embodiments, the uppermost plate of the plurality of conductive plates 102a-102d has a "T" shape from one perspective, while the rest of the plurality of conductive plates 102a-102d line lower surfaces of the uppermost plate of the plurality of conductive plates 102a-102d. This configuration increases the capacitance of the MIM device 104 without increasing the area.

In some embodiments, the plurality of conductive plates 102a-102d comprise a first conductive plate 102a, a second conductive plate 102b, a third conductive plate 102c, and a fourth conductive plate 102d. The plurality of conductive plates 102a-102d are vertically spaced from one another. For example, the first conductive plate 102a is vertically spaced from the second conductive plate 102b, the second conductive plate 102b is vertically spaced from the third conductive plate 102c, and the third conductive plate 102c is vertically spaced from the fourth conductive plate 102d. In some embodiments, the plurality of conductive plates 102a-102d are conductive and are or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, each of the plurality of conductive plates 102a-102d are or comprise a same material. For example, in some embodiments, the first conductive plate 102a, the second conductive plate 102b, the third conductive plate 102c, and the fourth conductive plate 102d are each titanium nitride (TiN).

The plurality of capacitor insulator structures 114a-114d comprise at least two (2) capacitor insulator structures. In some embodiments, the plurality of capacitor insulator structures 114a-114d comprises a first capacitor insulator structure 114a, a second capacitor insulator structure 114b, a third capacitor insulator structure 114c, and a fourth capacitor insulator structure 114d. The plurality of capacitor insulator structures 114a-114d comprise a number of capacitor insulator structures that is equal to or less than the number of conductive plates of the plurality of conductive plates 102a-102d. For example, as shown in the cross-sectional view 200, the plurality of conductive plates 102a-102d comprises four (4) conductive plates (e.g., the first conductive plate 102a, the second conductive plate 102b, the third conductive plate 102c, and the fourth conductive plate 102d) and the plurality of capacitor insulator structures 114a-114d comprises four (4) capacitor insulator structures (e.g., the first capacitor insulator structure 114a, the second capacitor insulator structure 114b, the third capacitor insulator structure 114c, and the fourth capacitor insulator structure 114d). In other embodiments, the plurality of conductive plates may comprise four conductive plates and the plurality of capacitor insulator structures may comprise three capacitor insulator structures.

In some embodiments, the plurality of capacitor insulator structures 114a-114d are or comprise, for example, zirconium oxide ($ZrO_2$), aluminum oxide ($Al_2O_3$), hafnium oxide ($HfO_2$), hafnium aluminum oxide (HfAlO), tantalum oxide ($Ta_2O_5$), some other dielectric material, or any combination of the foregoing. In some embodiments, the plurality of capacitor insulator structures 114a-114d are or comprise a metal oxide (e.g., $ZrO_2$, $Al_2O_3$, $HfO_2$, HfAlO, $Ta_2O_5$, or the like) and/or are or comprise a high-k dielectric material (e.g., a dielectric material having a dielectric constant greater than about 3.9, or some other suitable value). In some embodiments, each of the plurality of capacitor insulator structures 114a-114d are or comprise a same material.

In some embodiments, three of the plurality of capacitor insulator structures 114a-114c are disposed between and electrically isolate neighboring conductive plates of the plurality of conductive plates 102a-102d. For example, the first conductive plate 102a neighbors the second conductive plate 102b, the second conductive plate 102b neighbors the third conductive plate 102c, and the third conductive plate 102c neighbors the fourth conductive plate 102d. The first capacitor insulator structure 114a is disposed between (e.g., laterally and/or vertically between) the first conductive plate 102a and the second conductive plate 102b. The first capacitor insulator structure 114a also electrically isolates the first conductive plate 102a from the second conductive plate 102b. The second capacitor insulator structure 114b is disposed between (e.g., laterally and/or vertically between) the second conductive plate 102b and the third conductive plate 102c. The second capacitor insulator structure 114b also electrically isolates the second conductive plate 102b from the third conductive plate 102c. The third capacitor insulator structure 114c is disposed between (e.g., laterally and/or vertically between) the third conductive plate 102c and the fourth conductive plate 102d. The third capacitor insulator structure 114c also electrically isolates the third conductive plate 102c from the fourth conductive plate 102d. In this example, the fourth capacitor insulator structure 114d overlies the fourth conductive plate 102d.

In some embodiments, the plurality of conductive plates 102a-102d each have a first thickness between approximately 10 angstroms (Å) and approximately 500 Å, between approximately 500 angstroms (Å) and approximately 1000 Å, between approximately 10 angstroms (Å) and approximately 1000 Å, or other suitable ranges. In some embodiments, the plurality of capacitor insulator structures 114a-114d each have a first thickness between approximately 10 angstroms (Å) and approximately 200 Å, between approximately 200 angstroms (Å) and approximately 500 Å, between approximately 10 angstroms (Å) and approximately 500 Å, or other suitable ranges. In some embodiments, the thickness of each of the plurality of conductive plates 102a-102d is approximately the same. In some embodiments, the thickness of each of the plurality of capacitor insulator structures 114a-114d is approximately the same.

A first group of conductive plates of the plurality of conductive plates 102a-102d are electrically coupled together. The first group of conductive plates comprises a lowermost plate of the plurality of conductive plates 102a-102d. Further, a second group of conductive plates of the plurality of conductive plates 102a-102d are electrically coupled together. The first group of conductive plates are electrically isolated from the second group of conductive plates. The conductive plates of the first group of conductive plates and the conductive plates of the second group of conductive plates are vertically stacked and alternate back and forth from a lowermost conductive plate of the plurality of conductive plates 102a-102d to an uppermost conductive plate of the plurality of conductive plates 102a-102d.

For example, the first group of conductive plates comprises the first conductive plate 102a and the third conductive plate 102c. The second group of conductive plates comprises the second conductive plate 102b and the fourth conductive plate 102d. The first conductive plate 102a is electrically coupled to the third conductive plate 102c. The second conductive plate 102b is electrically coupled to the fourth conductive plate 102d. In some embodiments, the first conductive plate 102a is the lowermost conductive plate of the plurality of conductive plates 102a-102d. The first conductive plate 102a, the second conductive plate 102b, the third conductive plate 102c, and the fourth conductive plate 102d are vertically stacked. The second conductive plate 102b is disposed vertically between the first conductive plate 102a and the third conductive plate 102c. The second conductive plate 102b neighbors both the first conductive plate 102a and the third conductive plate 102c.

A first conductive plug structure 106 electrically couples the first group of conductive plates together. For example, the first conductive plug structure 106 electrically couples the first conductive plate 102a to the third conductive plate 102c. The first conductive plug structure 106 is disposed within MIM device 104, and extends from the top of the MIM device 104 to an uppermost surface of the first conductive plate 102a. In some embodiments, the first conductive plug structure 106 comprises a plurality of sidewalls that are coupled together by a lower surface that is between a top and bottom of the first conductive plug structure 106. In some embodiments, the first conductive plug structure 106 is or comprises, for example, copper (Cu), aluminum (Al), gold (Au), silver (Ag), some other conductive material, or a combination of the foregoing. In some embodiments, the first conductive plug structure 106 is or comprises a same material as a second conductive plug structure 108. In some embodiments, the first conductive plug structure 106 comprises a first lower surface that contacts an upper surface of the first conductive plate 102a and a second lower surface that contacts an upper surface of the third conductive plate 102c. Because the first conductive plug structure 106 electrically couples the first group of conductive plates together, and because the first electrode 110 is electrically coupled to the lowermost plate (e.g., the first conductive plate 102a) of the plurality of conductive plates 102a-102d, each of the conductive plates of the first group of conductive plates are electrically coupled to the first electrode 110.

A second conductive plug structure 108 electrically couples the second group of conductive plates together. For example, the second conductive plug structure 108 electrically couples the second conductive plate 102b to the fourth conductive plate 102d. The second conductive plug structure 108 is disposed within MIM device 104, and extends from the top of the MIM device 104 to an uppermost surface of the second conductive plate 102b. In some embodiments, the second conductive plug structure 108 comprises a plurality of sidewalls that are coupled together by a lower surface that is between a top and bottom of the second conductive plug structure 108. In some embodiments, the second conductive plug structure 108 is or comprises, for example, copper (Cu), aluminum (Al), gold (Au), silver (Ag), some other conductive material, or a combination of the foregoing. In some embodiments, the second conductive plug structure 108 is or comprises a same material as a first conductive plug structure 106. In some embodiments, the second conductive plug structure 108 comprises a first lower surface that contacts an upper surface of the second conductive plate 102b and a second lower surface that contacts an upper surface of the fourth conductive plate 102d. In some embodiments, a bottommost surface of the second conductive plug structure 108 is directly over and spaced from the first conductive plate 102a, and the bottommost surface of the second conductive plug structure 108 is directly over and contacting the second conductive plate 102b. Because the second conductive plug structure 108 electrically couples the second group of conductive plates together, and because the second electrode 112 is electrically coupled to the second conductive plug structure, each of the conductive plates of the second group of conductive plates are electrically coupled to the second electrode 112.

The MIM device 104 is positioned within an inter-layer dielectric (ILD) structure 204 which overlies a substrate 202. The substrate 202 comprises any type of semiconductor body (e.g., monocrystalline silicon/CMOS bulk, germanium (Ge), silicon-germanium (SiGe), a III-V semiconductor, silicon on insulator (SOI), etc.). The ILD structure 204 comprises one or more stacked ILD layers 205 separated by etch stop layers 206. In some embodiments, the one or more stacked ILD layers 205 may comprise a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. In some embodiments, the etch stop layers 206 comprise a nitride (e.g., SiN), an oxy-nitride (e.g., SiON), a carbide (e.g., SiC), some other dielectric material, or a combination of the foregoing. While not shown, it will be appreciated that any number of semiconductor devices (e.g., metal-oxide-semiconductor field-effect transistors (MOSFETs)) may be disposed on/over the substrate 202.

A first interconnect structure (not shown) (e.g., copper interconnect) is embedded in the ILD structure 204 and overlies the substrate 202. The first interconnect structure comprises a plurality of conductive features (e.g., metal wires, metal vias, metal contacts, etc.). For example, the first interconnect structure may comprise a first conductive feature (e.g., a copper wire) electrically coupled to a first electrode 110. The plurality of conductive features are or comprise, for example, copper (Cu), aluminum (Al), gold (Au), silver (Ag), some other conductive material, or a combination of the foregoing. The first interconnect structure is configured to electrically couple the semiconductor devices of the IC together in a predefined manner, and is electrically coupled to the first electrode 110.

Insulative segments 116a-116c line sidewalls of the MIM device 104. In some embodiments, the insulative segments 116a-116c may further line uppermost surfaces of the MIM device 104, isolating the plurality of conductive plates 102a-102d from other devices in the ILD structure 204. Of the insulative segments, a first plurality of insulative segments 116a-116b are positioned along sidewalls of the first conductive plug structure 106. The first plurality of insulative segments 116a-116b are positioned between the second conductive plate 102b and fourth conductive plate 102d and the first conductive plug structure 106 and are disposed on opposite sides of the first conductive plug structure 106. Of the first plurality of insulative segments 116a-116b, first insulative segments 116a isolate the second conductive plate 102b from the first conductive plug structure 106, and extend from an uppermost surface of the first conductive plate 102a to an uppermost surface of the third conductive plate 102c. Second insulative segments 116b of the first plurality of insulative segments 116a-116b are positioned along sidewalls of the first conductive plug structure 106. The second insulative segments 116b isolate the fourth conductive plate 102d from the first conductive plug structure 106, and extend from an uppermost surface of the third conductive plate 102c to above an uppermost surface of the MIM device 104.

Third insulative segments 116c are positioned along sidewalls of the second conductive plug structure 108. The third insulative segments 116c are positioned between the third conductive plate 102c and the second conductive plug structure 108, and are disposed on opposite sides of the second conductive plug structure 108. These third insulative segments 116c extend from the uppermost surface of the second conductive plate 102b to an uppermost surface of the fourth conductive plate 102d. The first conductive plate 102a is not separated from the second conductive plug structure 108 by the third insulative segments 116c. Instead, the first conductive plate 102a is separated from the second conductive plug structure 108 by the second conductive plate 102b and the first capacitor insulator structure 114a.

These insulative segments 116a-116c leave exposed several connective surfaces 208a-208d through which the plurality of conductive plates 102a-102d are electrically coupled to the first conductive plug structures 106 and second conductive plug structures 108. These connective surfaces 208a-208d comprise a plurality of faces of the first conductive plug structures 106 and second conductive plug structures 108. In some embodiments, the first conductive plate 102a and the first conductive plug structure 106 are coupled through a first face 208a, and the third conductive plate 102c and the first conductive plug structure 106 are coupled through a second face 208b. In some embodiments, the second face 208b surrounds the first face 208a. In some embodiments, the second conductive plate 102b and the second conductive plug structure 108 are coupled through a third face 208c, and the fourth conductive plate 102d and the second conductive plug structure 108 are coupled through a fourth face 208d. In some embodiments, the fourth face 208d surrounds the third face 208c.

A second interconnect structure (not shown) (e.g., copper interconnect) is embedded in the ILD structure 204 and overlies the substrate 202. The second interconnect structure comprises a plurality of conductive features (e.g., metal wires, metal vias, etc.). For example, the second interconnect structure comprises a first conductive feature (e.g., a copper wire). The plurality of conductive features are or comprise, for example, copper (Cu), aluminum (Al), gold (Au), silver (Ag), some other conductive material, or a combination of the foregoing. The second interconnect structure is electrically coupled to the second electrode 112. In some embodiments, the conductive features of the second interconnect structure are electrically coupled to the conductive features of the first interconnect structure. In other words, the first interconnect structure and the second interconnect structure are portions of a larger interconnect structure that is configured to electrically couple the semiconductor devices of the IC in a predefined manner.

An interconnect 210 electrically couples the second electrode 112 to the second conductive plug structure 108. For example, as shown in the cross-sectional view 200a of FIG. 2, the interconnect 210 extends from the second electrode 112 to the second conductive plug structure 108. In some embodiments, because the second conductive plate 102b and the fourth conductive plate 102d make up the second group of conductive plates and are electrically coupled to the second conductive plug structure 108 through a third face 208c and a fourth face 208d, respectively, and because the interconnect 210 electrically couples the second electrode 112 to the second conductive plug structure 108, each of the conductive plates of the second group of conductive plates are electrically coupled to the second electrode 112 via the interconnect 210.

The interconnect 210 extends vertically (e.g., in a substantially vertical line) through an upper ILD layer 205u and an upper etch stop layer 206u. The interconnect 210 is or comprises, for example, copper (Cu), aluminum (Al), gold (Au), silver (Ag), some other conductive material, or a combination of the foregoing. In some embodiments, the interconnect 210 has a lower surface that is co-planar with a lower surface of the upper etch stop layer 206u.

Figure 3:
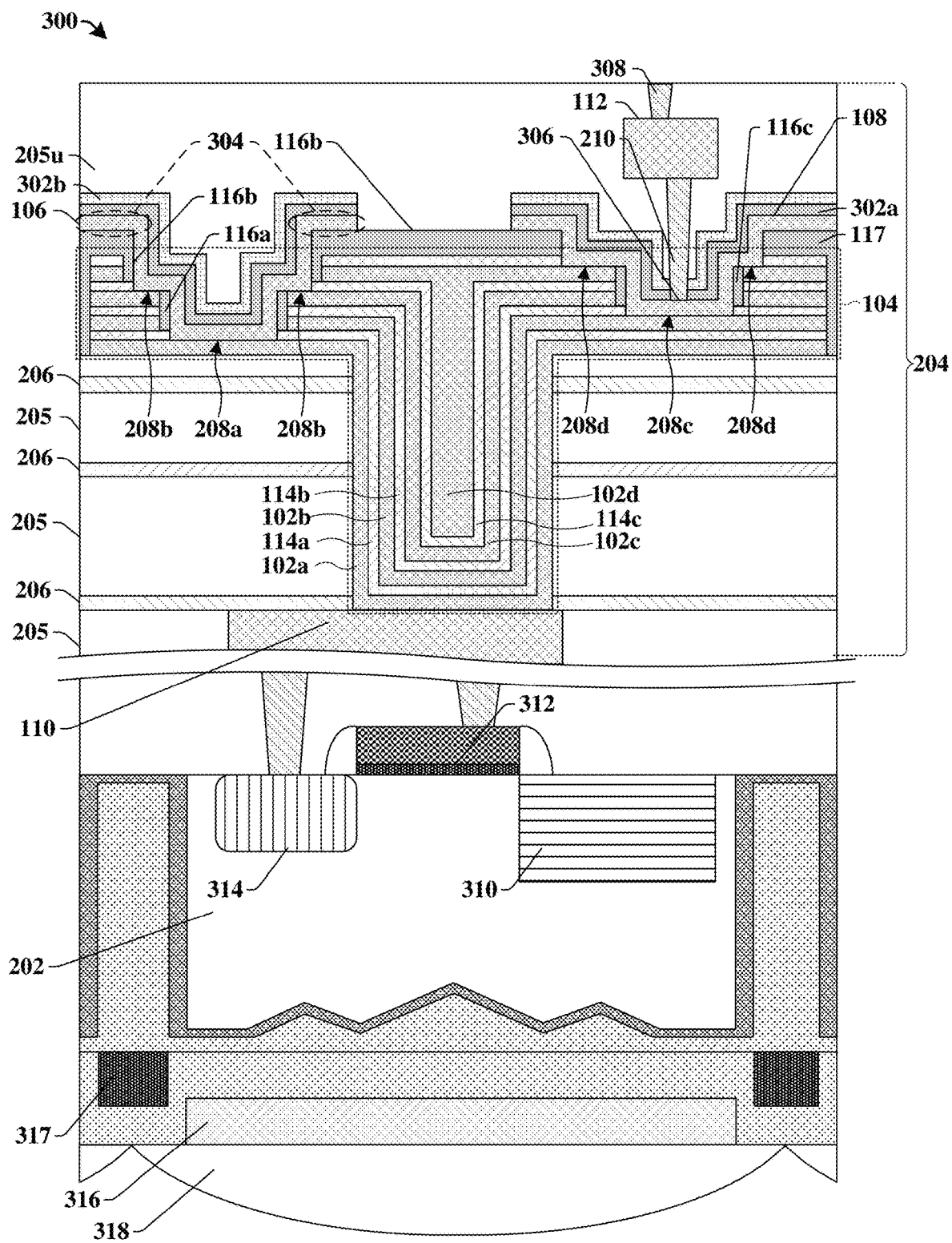
FIG. 3 illustrates a cross-sectional view of some other embodiments of an integrated chip having a MIM device with a plurality of conductive plates and conductive plug structures selectively coupled to the plurality of conductive plates.

FIG. 3 illustrates a cross-sectional view of some other embodiments of an integrated chip 300 having a MIM device 104 with the plurality of conductive plates 102a-102d and conductive plug structures selectively coupled to the plurality of conductive plates 102a-102d.

As shown in FIG. 3, the MIM device 104 is disposed within an ILD structure 204 arranged on a first side of a substrate 202. The MIM device is arranged between a first electrode 110 and a second electrode 112. The MIM device 104 comprises a first conductive plug structure 106 and a second conductive plug structure 108 lining the first plurality of insulative segments 116a-116b and the third insulative segments 116c respectively. The first conductive plug structure 106 is electrically coupled to the first conductive plate 102a through the first face 208a and is electrically coupled to the third conductive plate 102c through the second face 208b. The first plurality of insulative segments 116a-116b isolate and space the first conductive plug structure 106 from the second conductive plate 102b and fourth conductive plate 102d, respectively. In some embodiments, the first conductive plug structure 106 has an uppermost lower surface extending directly over an uppermost surface of the second insulative segments 116b and extending directly over and spaced from an uppermost conductive plate of the plurality of conductive plates 102a-102d. The first conductive plug structure 106 has a plurality of upper surfaces, in addition to a lowermost upper surface which is between first insulative segments 116a. The first conductive plug structure 106 has a substantially constant thickness between the second insulative segments 116b.

The second conductive plug structure 108 is electrically coupled to the second conductive plate 102b through the third face 208c and is electrically coupled to the fourth conductive plate 102d through a fourth face 208d. The third insulative segments 116c isolate and space the second conductive plug structure 108 from the third conductive plate 102c. The second conductive plug structure 108 is spaced from the first conductive plate 102a by the second conductive plate 102b and the first capacitor insulator structure 114a. The second conductive plug structure 108 extends directly above the uppermost surface of the insulative segments 116a-116c, over each of the plurality of capacitor insulator structures 114a-114d, and has a plurality of upper surfaces. In addition, it has a lowermost upper surface which is between third insulative segments 116c. The second conductive plug structure 108 has a substantially constant thickness between the third insulative segments 116c.

The first conductive plug structure 106 and the second conductive plug structure 108 are each covered by protection films 302a-302b. First protection films 302a are directly over and conform to the upper surfaces of the first conductive plug structure 106 and second conductive plug structure 108. Second protection films 302b are directly over and conform to upper surfaces of the first protection films 302a. The protection films 302a-302b are spaced from one another and surrounded by one of the stacked ILD layers 205. In some embodiments, the protection films 302a-302b respectively comprise a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), another suitable material, or a combination of the forgoing. In some embodiments, the first conductive plug structure 106 and second conductive plug structure 108 comprise titanium (Ti), titanium nitride (TiN), tantalum (Ta), tantalum nitride (TaN), aluminum (Al), aluminum titanium (AlTi), some other conductive material, or a combination of the foregoing. In some embodiments, the first conductive plug structure 106 and the second conductive plug structure 108 each have an uppermost lower surface 304 extending directly over an uppermost surface of the insulative segments 116a-116c.

The interconnect 210 extends through the protection films 302a-302b to a lowermost upper surface 306 of the second conductive plug structure 108. The second electrode 112 is electrically coupled to the interconnect 210, and is also electrically coupled to the second interconnect structure 308.

In some embodiments, the first electrode 110 of the MIM device 104 is electrically coupled to an image sensing element 310 disposed within the substrate 202. In some embodiments, the image sensing element 310 is coupled to the MIM device 104 by way of a gate structure 312 disposed on the substrate 202 between the image sensing element 310 and a floating diffusion node 314. During operation, the gate structure 312 is configured to control the flow of charges, which have accumulated within the image sensing element 310, to the floating diffusion node 314. In some embodiments, a color filter 316 is disposed on a second side of the substrate 202 within a grid structure 317, and a micro-lens 318 covers the color filter 316. In some embodiments, the gate structure 312 corresponds to a transfer transistor in a CMOS image sensor. In some embodiments, the grid structure 317 laterally surrounds each image sensing element 310 and color filter 316 with a lattice of grid segments. In some embodiments, the micro-lens 318 may be laterally aligned with the color filter 316. The image sensing element 310 is configured to convert incident radiation (e.g., photons) into an electric signal (i.e., to generate electron-hole pairs from the incident radiation). In various embodiments, the image sensing element 310 may comprise a photodiode, a photo-detector, or the like.

Figure 4:
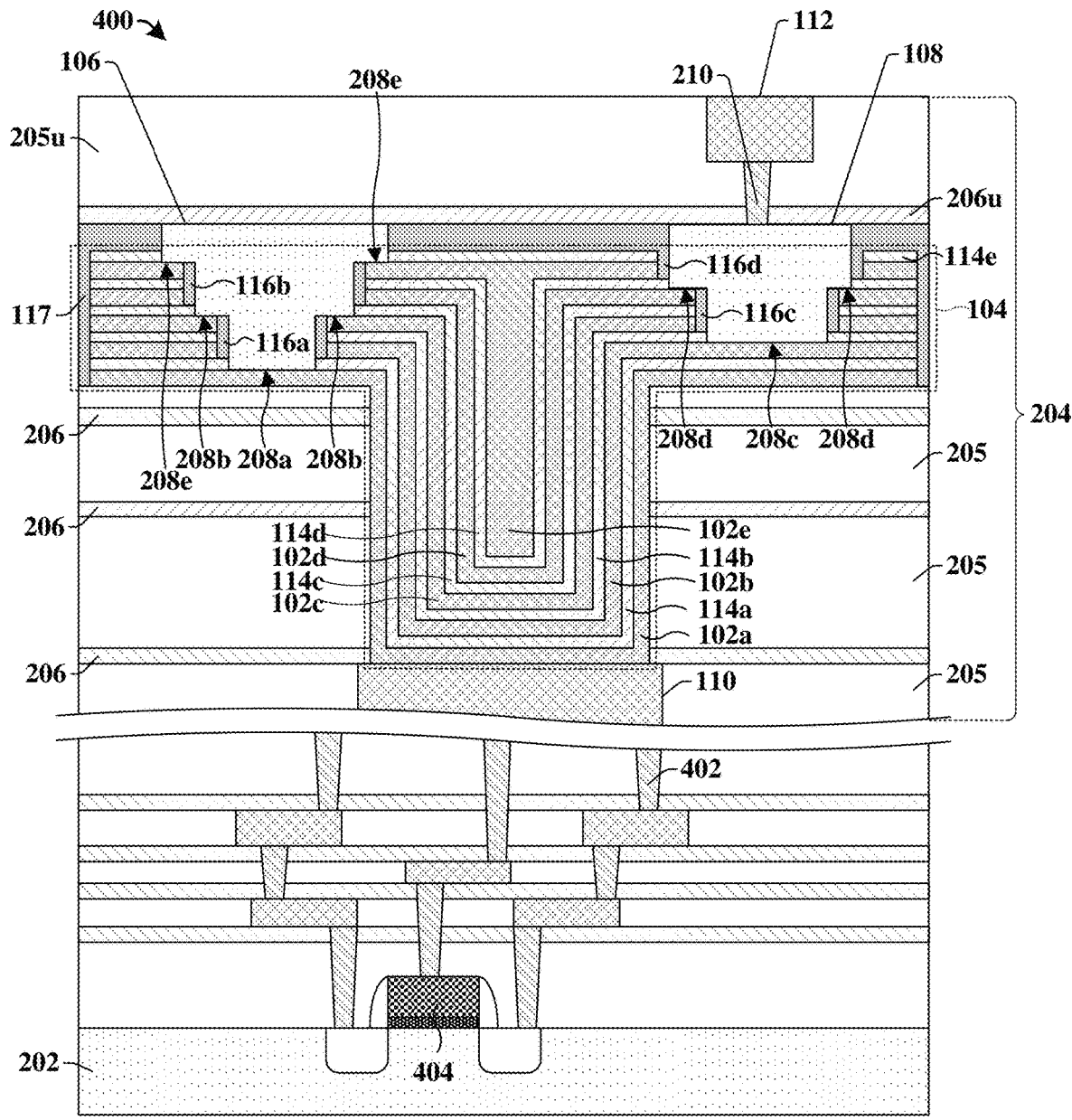
FIG. 4 illustrates a cross-sectional view of additional embodiments of an integrated chip having a MIM device with a plurality of conductive plates and conductive plug structures selectively coupled to the plurality of conductive plates.

FIG. 4 illustrates a cross-sectional view of additional embodiments of an integrated chip having a MIM device with the plurality of conductive plates 102a-102d and conductive plug structures selectively coupled to the plurality of conductive plates 102a-102d.

As shown in FIG. 4, some embodiments have a plurality of conductive plates 102a-102e comprising more than four conductive plates. By having more than four conductive plates, the capacitance of the MIM device can be further increased. In these embodiments, additional insulative segments of the first plurality of insulative segments 116a-116b and a second plurality of insulative segments 116c-116d are also used to isolate additional conductive plates from the first conductive plug structures 106 and second conductive plug structures 108. For example, the embodiment shown in FIG. 4 has a second plurality of insulative segments 116c-116d comprising fourth insulative segments 116d configured to isolate the fifth conductive plate 102e from the second conductive plug structure 108. The fourth insulative segments 116d extend from an uppermost surface of the fourth capacitor insulator structure 114d to an uppermost surface of a fifth capacitor insulator structure 114e. In addition, the first conductive plug structure 106 has an additional lower surface that is electrically coupled to the fifth conductive plate 102e through a fifth face 208e. In some embodiments, the fifth face 208e surrounds the third face 208c and the first face 208a.

While the IC of FIG. 4 illustrates the plurality of conductive plates 102a-102e comprising five conductive plates, it will be appreciated that the plurality of conductive plates may comprise N plates, where N is any whole number greater than or equal to three (3). It will also be appreciated that the plurality of capacitor insulator structures comprise N capacitor insulator structures. It will further be appreciated that regardless of the value of N, the plurality of conductive plates and the plurality of capacitor insulator structures are stacked in a substantially similar manner as illustrated in the cross-sectional view 400 of FIG. 4, such that the conductive plates beneath the uppermost conductive plate conform to the lower surfaces of the uppermost conductive plate, and the connective surfaces and insulative segments are of sufficient size so that conductive features safely (e.g., not having unwanted electrical shorts) couple the first group of conductive plates together and the second group of conductive plates together, while ensuring electrical isolation between the first group of conductive plates and the second group of conductive plates.

In some embodiments, one or more semiconductor devices (e.g., transistors, MOSFETs, etc.), one or more interlayer dielectric (ILD) structures (e.g., low-k dielectric layers), one or more conductive contacts (e.g., metal contacts), or the like, are positioned between the substrate 202 and the MIM device 104. In this example, the first interconnect structure 402 electrically couples a semiconductor device 404 to the MIM device 104. In some embodiments, the semiconductor device 404 is further connected to other components (not shown) through the first interconnect structure 402.

FIGS. 5-15 illustrate a series of cross-sectional views 500-1500 of some embodiments of a method for forming an IC having a metal-insulator-metal MIM device (104 of FIGS. 1A-4) with improved performance. Although FIGS. 5-15 are described with reference to a method, it will be appreciated that the structures shown in FIGS. 5-15 are not limited to the method but rather may stand alone separate of the method.

Figure 5:
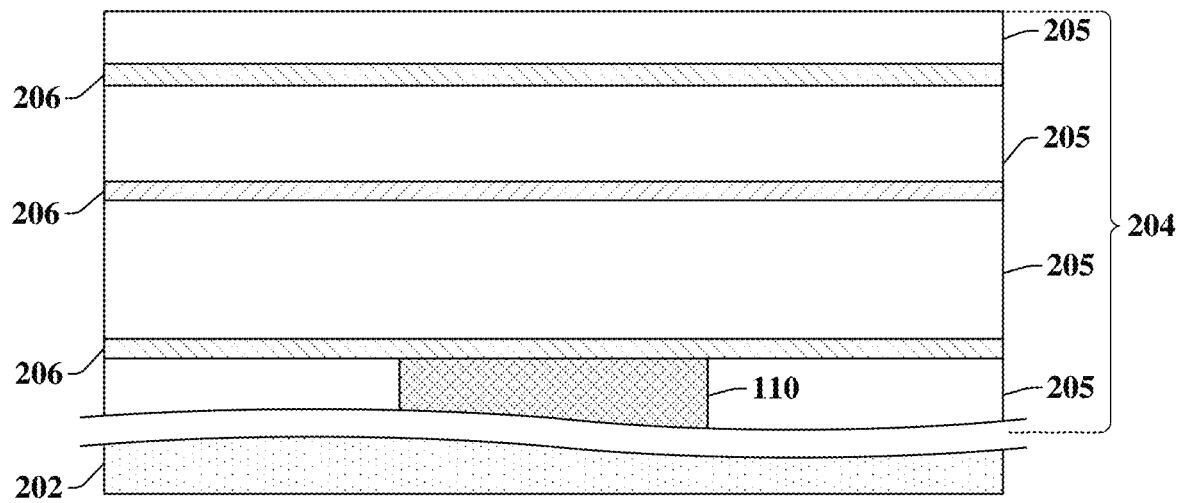
FIGS. 5-15 illustrate cross-sectional views of some embodiments of a method for forming an IC having a metal-insulator-metal MIM device with improved performance using conductive plug structures.

As shown in cross-sectional view 500 of FIG. 5, an ILD structure 204 comprising stacked ILD layers 205 and etch stop layers 206 are formed over a substrate 202. The ILD structure 204 is formed by, for example, chemical vapor deposition (CVD), physical vapor deposition (PVD), atomic layer deposition (ALD), some other process, or a combination of the foregoing. A first interconnect structure (not shown) (e.g., copper interconnect) is formed over the substrate 202 and within the ILD structure 204. The first interconnect structure is electrically coupled to a first electrode 110. In some embodiments, the first interconnect structure and first electrode 110 are formed by, for example, a dual damascene process and/or a single damascene process. In further embodiments, the first interconnect structure is formed by, for example, CVD, PVD, ALD, sputtering, electrochemical plating, electroless plating, some other deposition process, or a combination of the foregoing. While not shown in the cross-sectional view 500 of FIG. 5, it will be appreciated that one or more semiconductor devices (e.g., transistors, MOSFETs, etc.), may be formed before the ILD structure 204 by known complementary metal-oxide-semiconductor (CMOS) processes.

Figure 6:
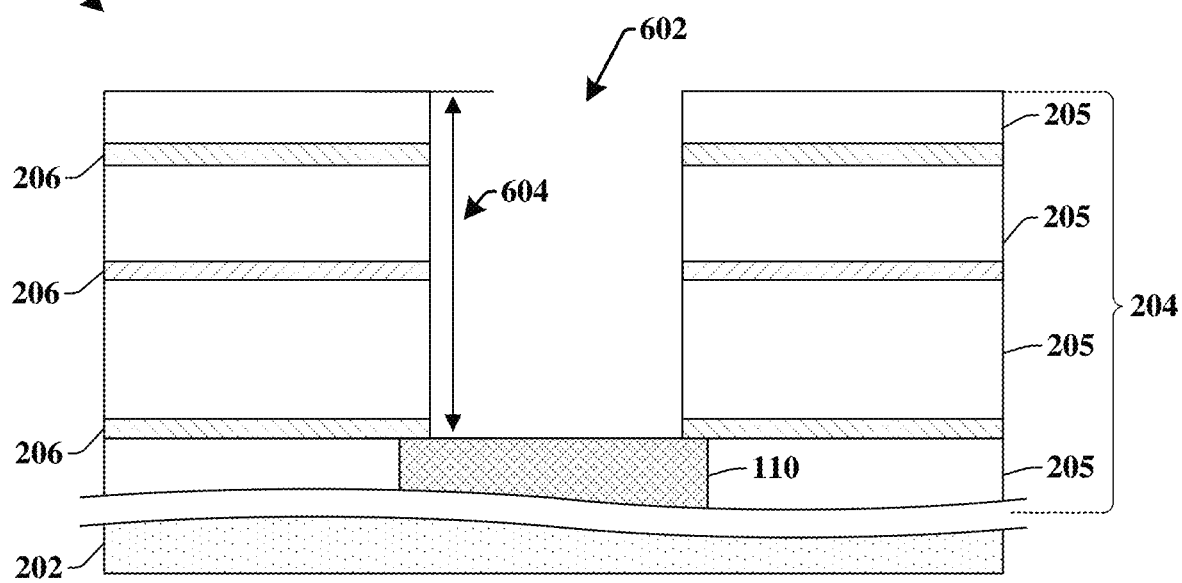

As shown in cross-sectional view 600 of FIG. 6, an opening 602 is formed in the ILD structure 204. The opening 602 exposes the first electrode 110. In some embodiments, the opening 602 is formed with substantially vertical sidewalls. In other embodiments, the opening 602 is formed with angled sidewalls.

In some embodiments, a process for forming the opening 602 comprises forming a patterned masking layer (not shown) (e.g., positive/negative photoresist, a hardmask, etc.) on an upper surface of the ILD structure 204. The patterned masking layer may be formed by forming a masking layer (not shown) on the upper surface of the ILD structure 204 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the ILD structure 204 to selectively etch the ILD structure 204 according to the patterned masking layer. The etching process removes unmasked portions of the ILD structure 204, thereby forming the opening 602. In some embodiments, the etching process may be, for example, a wet etching process, a dry etching process (e.g., plasma dry etching), a reactive ion etching (RIE) process, some other etching process, or a combination of the foregoing. In some embodiments, the opening 602 is etched to a depth 604 between about 100 nanometers (nm) and about 20 micrometers (μm), between about 20 micrometers (μm) and about 50 micrometers (μm), between about 100 nanometers (nm) and about 50 micrometers (μm), or within another suitable range of values.

Figure 7:
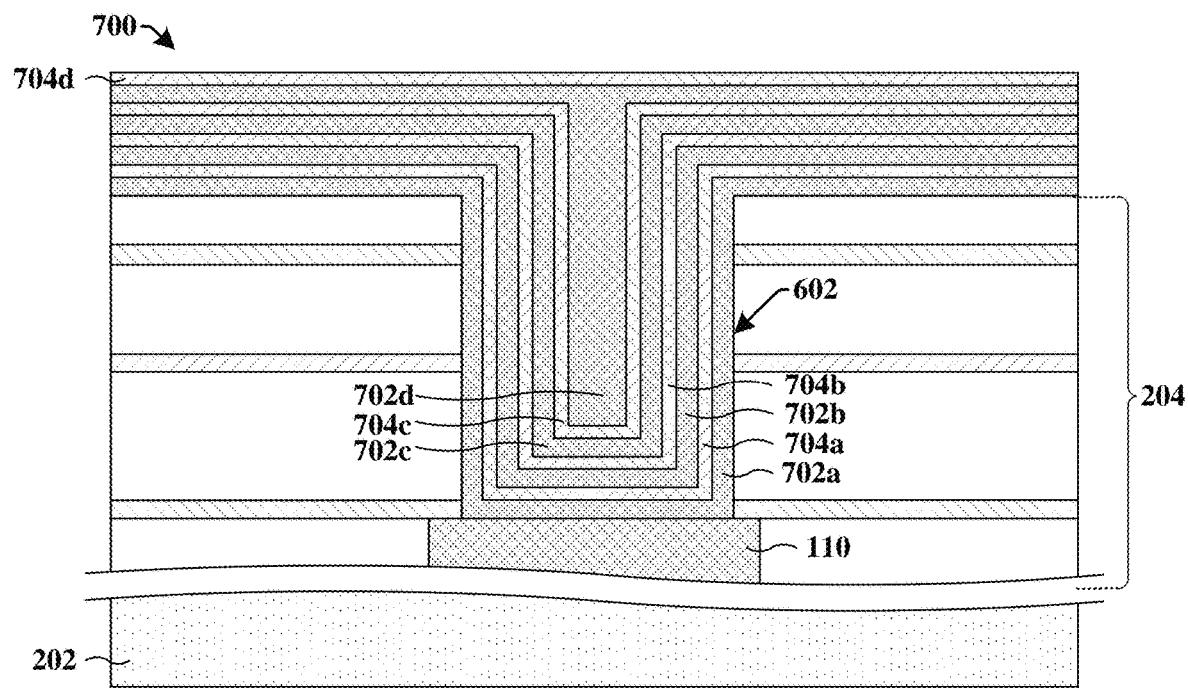

As shown in cross-sectional view 700 of FIG. 7, a plurality of conformal conductive layers 702a-702d and a plurality of conformal insulator layers 704a-704d are formed in an alternating stack over the ILD structure 204 and lining the opening 602. The first conductive layer 702a is formed on the first electrode 110. In some embodiments, a process for forming the conformal conductive layers 702a-702d comprises depositing the first conductive layer 702a on the ILD structure 204 and in (e.g., lining) the opening 602. The first conductive layer 702a may be deposited by, for example, ALD, CVD, PVD, electrochemical plating, electroless plating, sputtering, some other deposition process, or a combination of the foregoing. The first conductive layer 702a is conductive and may be or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, the first conductive layer 702a is deposited with a thickness between approximately 10 angstroms (Å) and approximately 1000 Å.

Thereafter, a first conformal insulator layer 704a is formed on the first conductive layer 702a. The first conformal insulator layer 704a may be or comprise, for example, zirconium oxide ($ZrO_2$), aluminum oxide ($Al_2O_3$), hafnium oxide ($HfO_2$), hafnium aluminum oxide (HfAlO), tantalum oxide ($Ta_2O_5$), some other dielectric material, or any combination of the foregoing. In some embodiments, the first conformal insulator layer 704a is or comprises a metal oxide (e.g., $ZrO_2$, $Al_2O_3$, $HfO_2$, HfAlO, $Ta_2O_5$, or the like) and/or is or comprises a high-k dielectric material.

In some embodiments, a process for forming the first conformal insulator layer 704a comprises depositing or growing the first conformal insulator layer 704a on the first conductive layer 702a. The first conformal insulator layer 704a may be deposited or grown by, for example, ALD, CVD, PVD, thermal oxidation, some other deposition or growth process, or a combination of the foregoing. In some embodiments, the first conformal insulator layer 704a is formed with a thickness between about 10 Å and about 500 Å.

Thereafter, the pattern repeats, alternating between growing an additional conformal conductive layer 702b-702d and an additional conformal insulator layer 704b-704d until the alternating stack is complete, as shown in FIG. 7.

Figure 8:
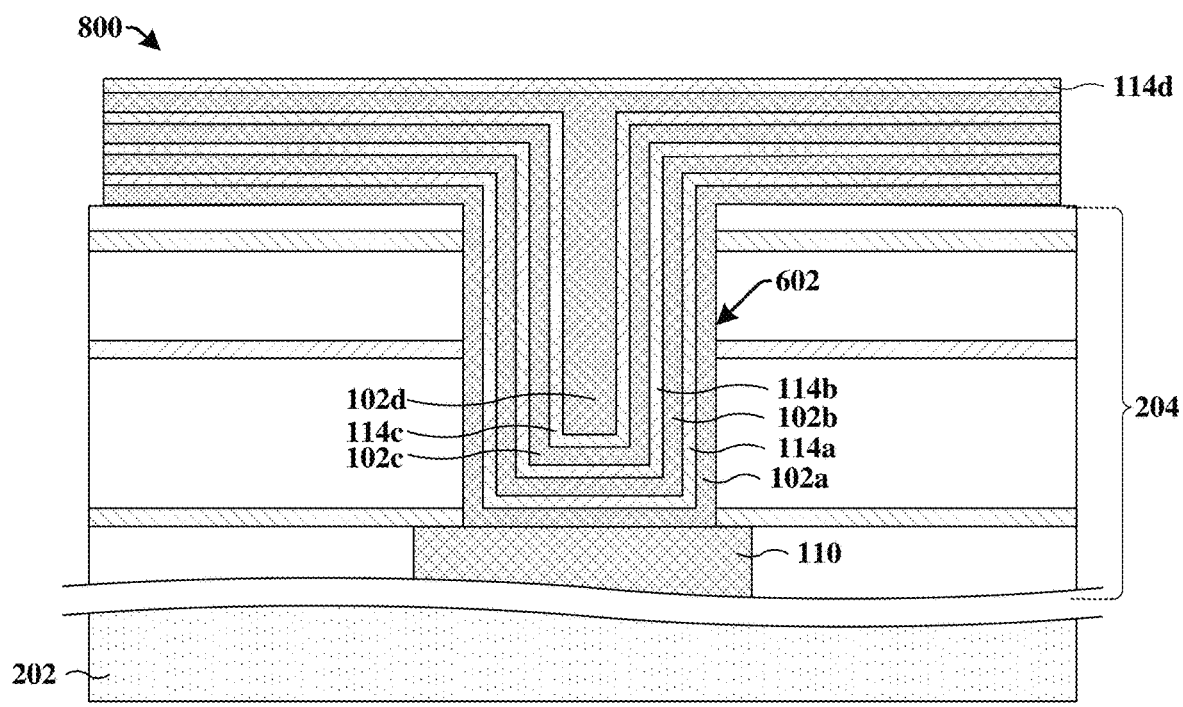

As shown in cross-sectional view 800 of FIG. 8, the plurality of conductive plates 102a-102d and the plurality of capacitor insulator structures 114a-114d are formed over the ILD structure 204 and in the opening 602.

In some embodiments, a process for forming the plurality of conductive plates 102a-102d and the plurality of capacitor insulator structures 114a-114d comprises forming a first patterned masking layer (not shown) (e.g., positive/negative photoresist, a hardmask, etc.) on/over the fourth conformal insulator layer 704d. The first patterned masking layer may be formed by depositing a masking layer (not shown) on/over the fourth conformal insulator layer 704d (e.g., via a spin-on process), exposing the masking layer to a first pattern (e.g., via a lithography process, such as photolithography, extreme ultraviolet lithography, or the like), and developing the masking layer to form the first patterned masking layer.

Thereafter, with the first patterned masking layer in place, a series of etching processes are performed on the plurality of conformal conductive layers 702a-702d and the plurality of conformal insulator layers 704a-704d to selectively etch them according to the first patterned masking layer. The series of etching processes remove unmasked portions of the alternating stack, thereby leaving masked portions of the alternating stack in place as the plurality of conductive plates 102a-102d and the plurality of capacitor insulator structures 114a-114d. In some embodiments, the series of etching processes may be, for example, wet etching processes, dry etching processes, RIE processes, some other etching process, or a combination of the foregoing. In some embodiments, the series of etching processes used on the conformal conductive layers 702a-702d may have the same etch chemistry, and the series of etching processes used on the conformal insulator layers 704a-704d may have the same etch chemistry. In some embodiments, the series of etching processes stop on the first ILD layer 205a (see FIG. 6). In some embodiments, the first patterned masking layer is subsequently stripped away.

Figure 9:
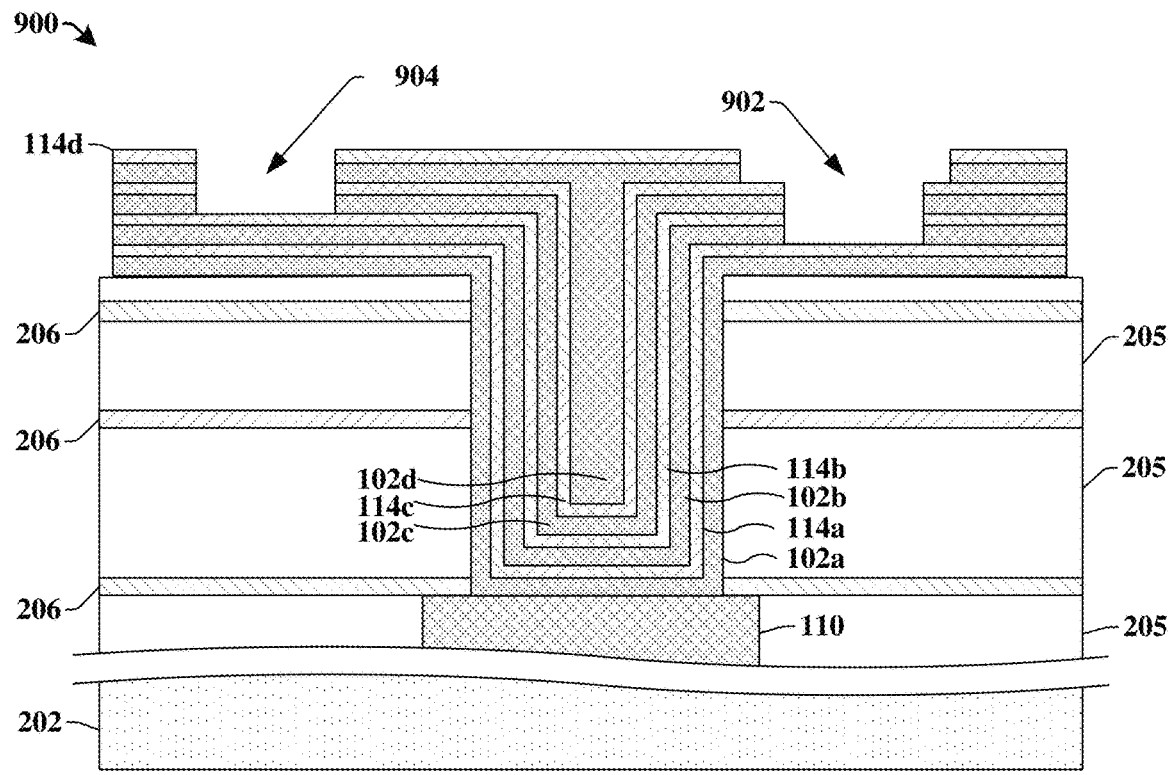

As shown in cross-sectional view 900 of FIG. 9, a first tiered plug hole 902 and a second tiered plug hole 904 are formed through an uppermost surface of the alternating stack. The tiers of the first tiered plug hole 902 and second tiered plug hole 904 each have a width and height. The width of the tiers furthest from the uppermost surface of the alternating stack is less than the width of the tiers closest to the uppermost surface of the alternating stack. The first tiered plug hole 902 has a number of tiers equal to N, where N is the number of conductive plates in the alternating stack divided by two, rounded down. The second tiered plug hole 904 has a number of tiers equal to M, where M is the number of conductive plates in the alternating stack minus one, divided by two, rounded down. For example, in the case of there being four conductive plates, the first tiered plug hole 902 has two tiers, and the second tiered plug hole has one tier. In some embodiments, the lowermost surface of the first tiered plug hole 902 is flush with a lower surface of the second conductive plate 102b, and the lowermost surface of the second tiered plug hole 904 is flush with a lower surface of the third conductive plate 102c. In some embodiments, when viewed from a top view, the first tiered plug hole 902 and the second tiered plug hole 904 are both circular, rectangular, or in another suitable configuration.

In some embodiments, a process for forming the first tiered plug hole 902 and the second tiered plug hole 904 comprises forming a patterned masking layer (not shown) (e.g., positive/negative photoresist, a hardmask, etc.) on an upper surface of an uppermost capacitor insulator structure 114d. With the patterned masking layer in place, one or more etching processes (e.g., wet etching process, dry etching process, RIE process, etc.) are performed on the fourth capacitor insulator structure 114d, the fourth conductive plate 102d, the third capacitor insulator structure 114c, the third conductive plate 102c, the second capacitor insulator structure 114b, and the second conductive plate 102b according to the patterned masking layer, thereby forming the first tiered plug hole 902 and the second tiered plug hole 904. In some embodiments, the patterned masking layer is subsequently stripped away.

Figure 10:
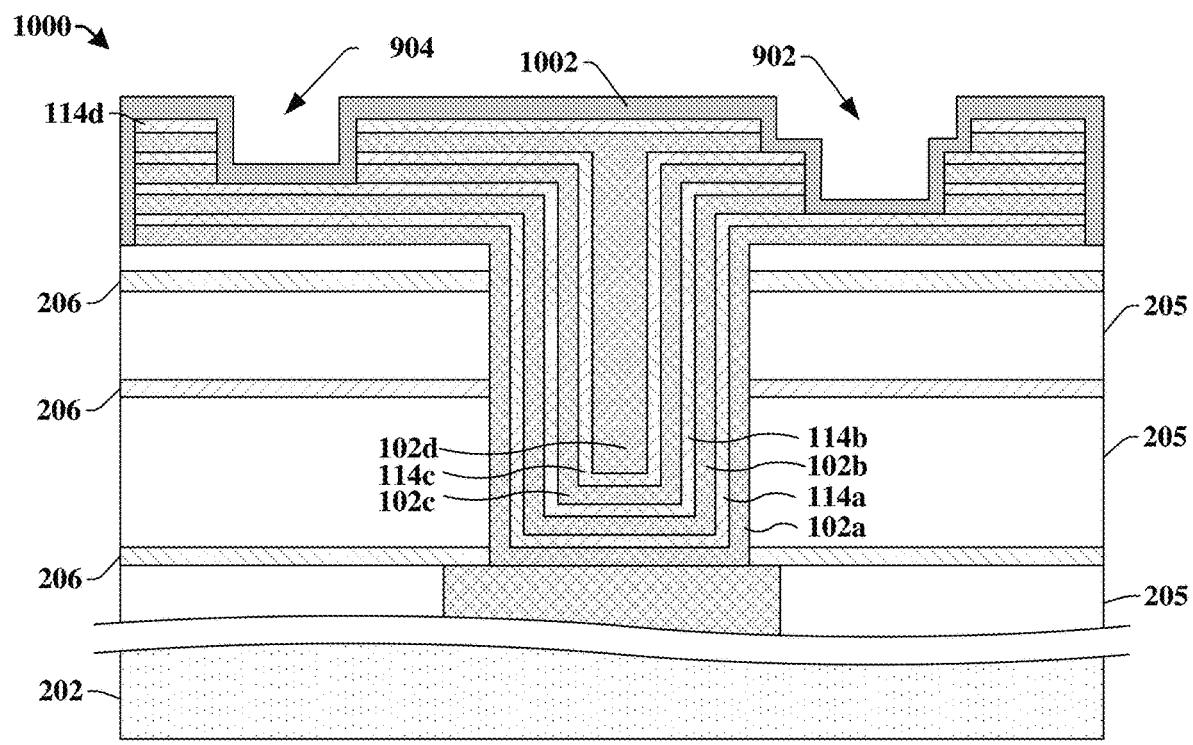

As shown in cross-sectional view 1000 of FIG. 10, an isolating material 1002 is formed over exposed surfaces of the alternating stack. The isolating material 1002 extends down outer sidewalls of the alternating stack, as well as into the first tiered plug hole 902 and second tiered plug hole 904. The isolating material 1002 comprises an oxide (e.g., silicon dioxide ($SiO_2$)), a nitride (e.g., silicon nitride (SiN)), an oxy-nitride (e.g., silicon oxy-nitride (SiON)), or other suitable materials. The isolating material is formed through chemical vapor deposition (CVD), physical vapor deposition (PVD), atomic layer deposition (ALD), or another suitable process.

Figure 11:
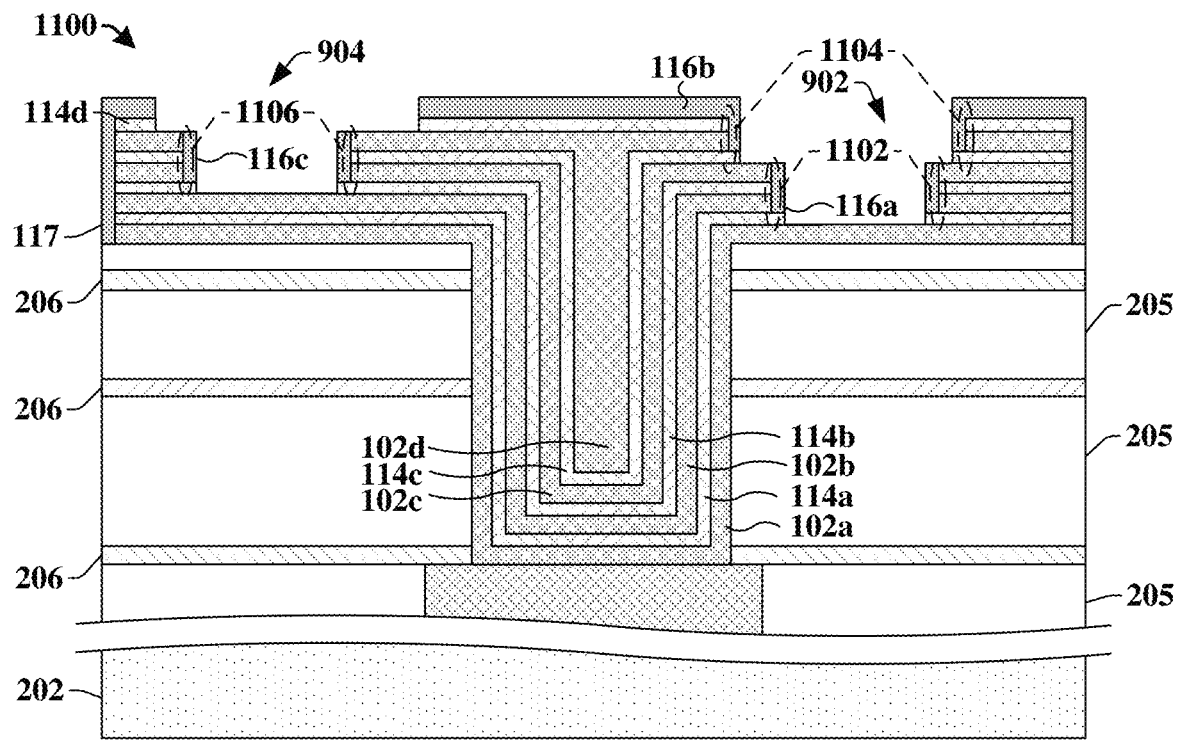

As shown in cross-sectional view 1100 of FIG. 11, the isolating material (1002 of FIG. 10) is partially removed. In some embodiments, the removal process comprises forming a patterned masking layer (not shown) (e.g., positive/negative photoresist, a hardmask, etc.) on an upper surface of the isolating material 1002. With the patterned masking layer in place, one or more etching processes (e.g., wet etching process, dry etching process, RIE process, etc.) are performed on exposed sections of the isolating material 1002, the first capacitor insulator structure 114a, the second capacitor insulator structure 114b, the third capacitor insulator structure 114c, and the fourth capacitor insulator structure 114d according to the patterned masking layer, thereby forming the first contact opening and the second contact opening. In some embodiments, the patterned masking layer is subsequently stripped away. In some embodiments, the patterned masking layer may be formed over uppermost surfaces of the fourth capacitor insulator structure 114d (e.g., outside of the tiered plug holes) and not onto underlying conductive and/or insulating layers (e.g., not within the tiered plug holes). In such embodiments, the patterned masking layer will be removed from horizontally extending surfaces within the tiered plug holes while remaining on vertically extending surfaces within the tiered plug holes, which span more than one of the conductive and/or insulating layers (e.g., due to a greater thickness of the patterned masking layer along the vertically extending surfaces).

The removal process leaves behind the insulative segments 116a-116c and the insulative barrier 117 surrounding the center and edges of the alternating stack, leaving behind the insulative barrier 117 around an edge of the alternating stack, and further leaving behind the first plurality of insulative segments 116a-116b, and the third insulative segments 116c within the first tiered plug hole 902 and second tiered plug hole 904, respectively. In some embodiments, the first insulative segments 116a are left on a first inner sidewall 1102 within the first tiered plug hole 902, the second insulative segments 116b are left on a second inner sidewall 1104 above the first inner sidewall within the first tiered plug hole 902, and the third insulative segments 116c are left on a third inner sidewall 1106 within the second tiered plug hole 904. In some embodiments, the first inner sidewall 1102 and the second inner sidewall 1104 are nested. In some embodiments, the first inner sidewall 1102 and the second inner sidewall 1104 are each ring shaped, and the second inner sidewall 1104 surrounds the first inner sidewall 1102.

The removal process also exposes the plurality of conductive plates 102a-102d by removing portions of the plurality of capacitor insulator structures 114a-114d in and near the first tiered plug hole 902 and the second tiered plug hole 904. In some embodiments, for example, the removal process exposes the first conductive plate 102a and third conductive plate 102c in the first tiered plug hole 902 and expose the second conductive plate 102b in the second tiered plug hole 904. In some embodiments, the placement of the insulative segments 116a-116c on top of the alternating stack and removal of the fourth capacitor insulator structure 114d over the fourth conductive plate 102d work in conjunction to act as an additional tier in the second tiered plug hole 904, leaving a space for a contact to later be added over the fourth conductive plate 102d and under the uppermost surface of the insulative segments 116a-116c. In an embodiment with an odd number of conductive plates, an additional tier would be created in this way in the first tiered plug hole 902.

Figure 12:
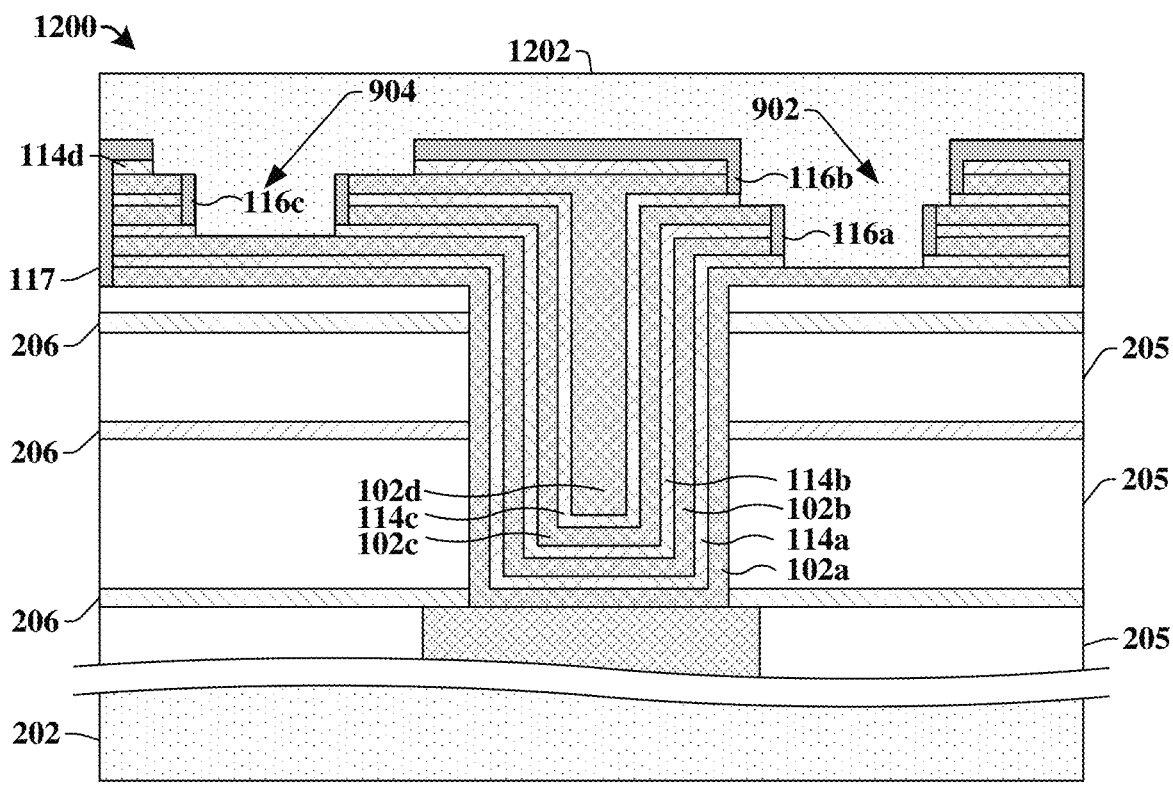

As shown in cross-sectional view 1200 of FIG. 12, a conductive layer 1202 is formed over the alternating stack. The conductive layer 1202 is formed by a deposition process (e.g., CVD, PVD, sputtering, etc.), a plating process (e.g., electrochemical plating, electroless plating, etc.), another suitable process, or a combination of foregoing. The conductive layer 1202 comprises, for example, copper (Cu), aluminum (Al), gold (Au), silver (Ag), some other conductive material, or a combination of the foregoing. The conductive layer 1202 is formed to line sidewalls within the first tiered plug hole 902 and second tiered plug hole 904. In some embodiments, the conductive layer 1202 fills the first tiered plug hole 902 and second tiered plug hole 904 completely, and has an uppermost surface covering the alternating stack. In some embodiments, the conductive layer 1202 lines the uppermost surface of the insulative segments 116a-116c.

Figure 13:
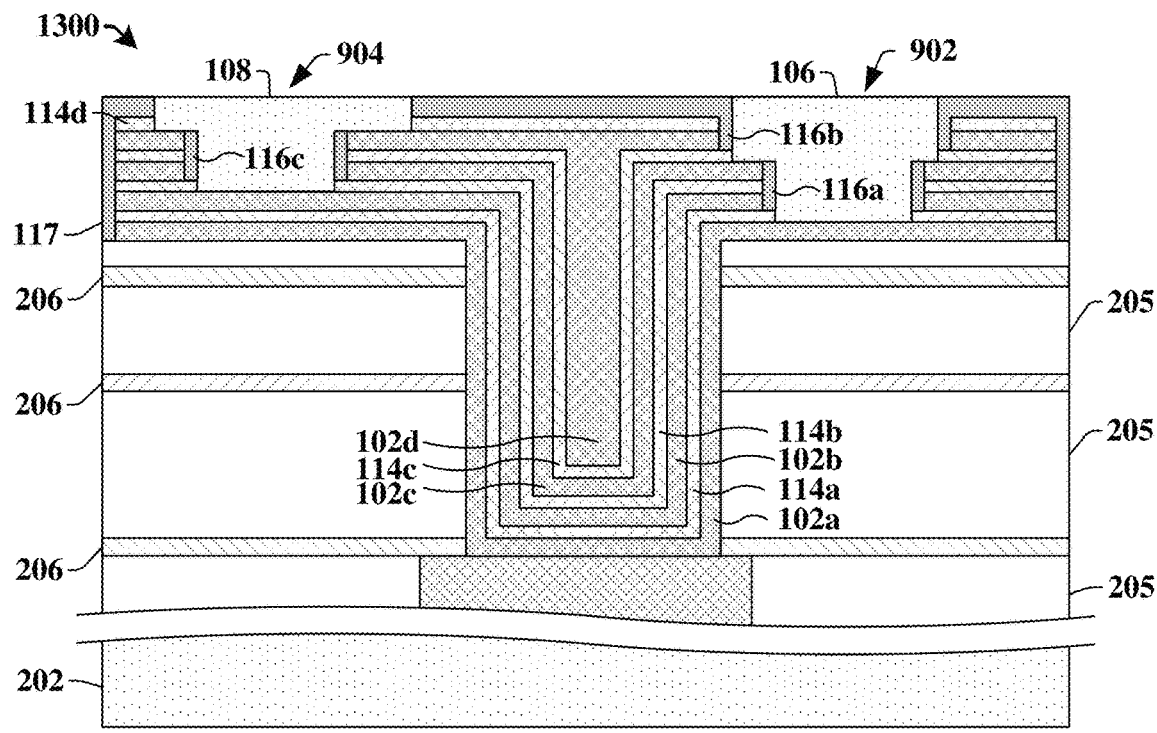

As shown in cross-sectional view 1300 of FIG. 13, a portion of the conductive layer (1202 of FIG. 12) is removed, and the remaining portions of the conductive layer form the first conductive plug structure 106 and second conductive plug structure 108.

In some embodiments, the portion of the conductive layer 1202 is removed through a planarization process (e.g., chemical mechanical polishing (CMP) process), wherein the conductive layer is removed down to the uppermost surface of the insulative segments 116a-116c. In this case, the upper surfaces of the first conductive plug structure 106, the second conductive plug structure 108, and the insulative segments 116a-116c are planarized, and the first conductive plug structure 106 is isolated from the second conductive plug structure 108 by the insulative segments 116a-116c.

Figure 14:
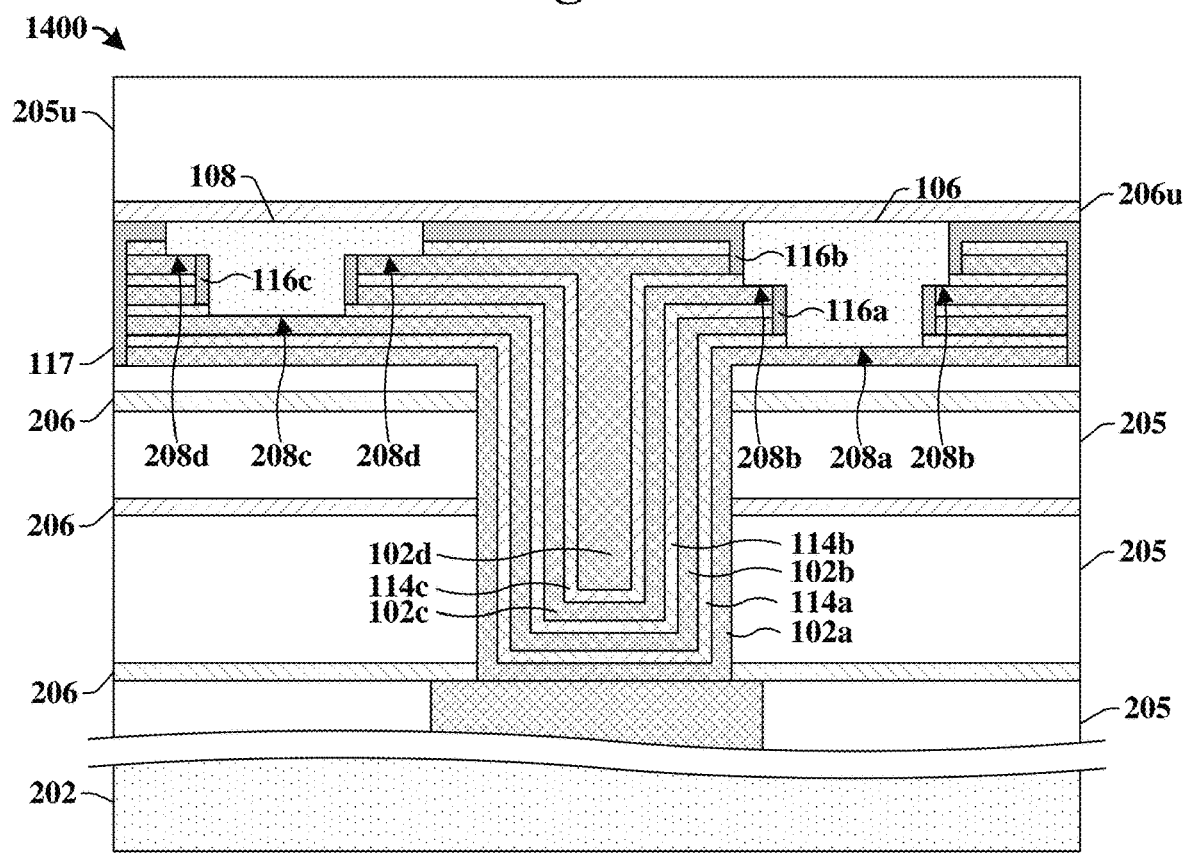

As shown in cross-sectional view 1400 of FIG. 14, an upper ILD layer 205u and an upper etch stop layer 206u are formed over the first conductive plug structure 106 and the second conductive plug structure 108. In some embodiments, the upper etch stop layer 206u is formed before the upper ILD layer 205u. The upper ILD layer 205u and upper etch stop layer 206u are formed through, for example, ALD, CVD, PVD, thermal oxidation, some other deposition or growth process, or a combination of the foregoing.

Figure 15:
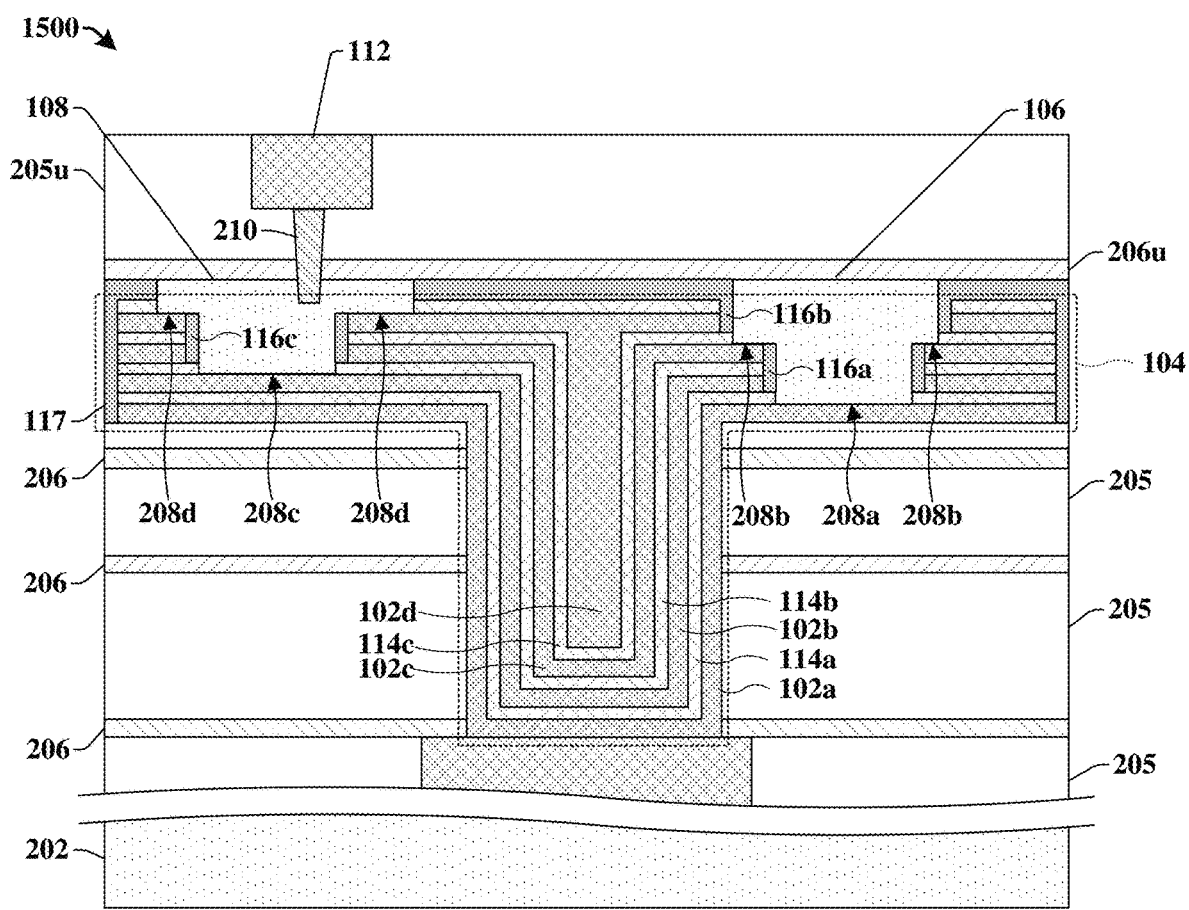

As shown in cross-sectional view 1500 of FIG. 15, the interconnect 210 and the second electrode 112 are formed within the upper ILD layer 205u and upper etch stop layer 206u. In some embodiments, the interconnect 210 extends through the upper etch stop layer 206u and into the second conductive plug structure 108. In some embodiments, the interconnect 210 and second electrode 112 each comprise one of tungsten, copper, aluminum, another conductive material, a combination of the above, or other suitable materials. In some embodiments, the interconnect 210 and second electrode are formed using a deposition process and/or a plating process (e.g., electroplating, electro-less plating, etc.). Although not shown, it will be appreciated that any number of other conductive features (e.g., conductive lines and conductive vias) and/or ILD layers may be formed over the upper ILD layer 205u, the upper etch stop layer 206u, and the second electrode 112 to couple the second conductive plug structure 108 to other devices in the IC.

FIGS. 16-26 illustrate a series of cross-sectional views 1600-2600 of some embodiments of a method for forming an IC having a metal-insulator-metal MIM device 104 with improved performance. Although FIGS. 16-26 are described with reference to a method, it will be appreciated that the structures shown in FIGS. 16-26 are not limited to the method but rather may stand alone separate of the method.

Figure 16:
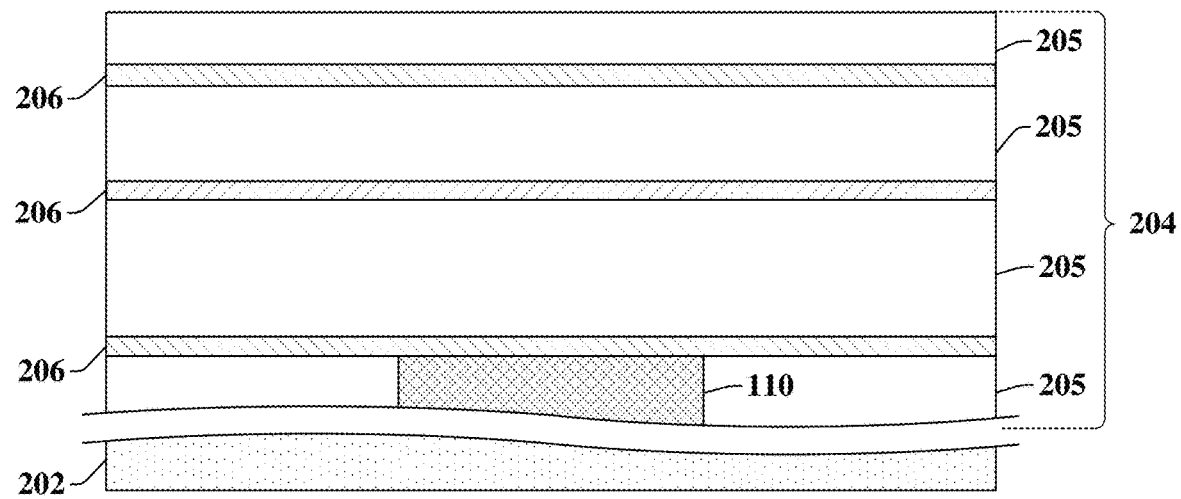
FIGS. 16-26 illustrate cross-sectional views of some embodiments of a method for forming an IC having a metal-insulator-metal MIM device with improved performance using conductive films.

As shown in cross-sectional view 1600 of FIG. 16, a substrate 202 is provided, along with the ILD structure 204 comprising stacked ILD layers 205 and etch stop layers 206.

Figure 17:
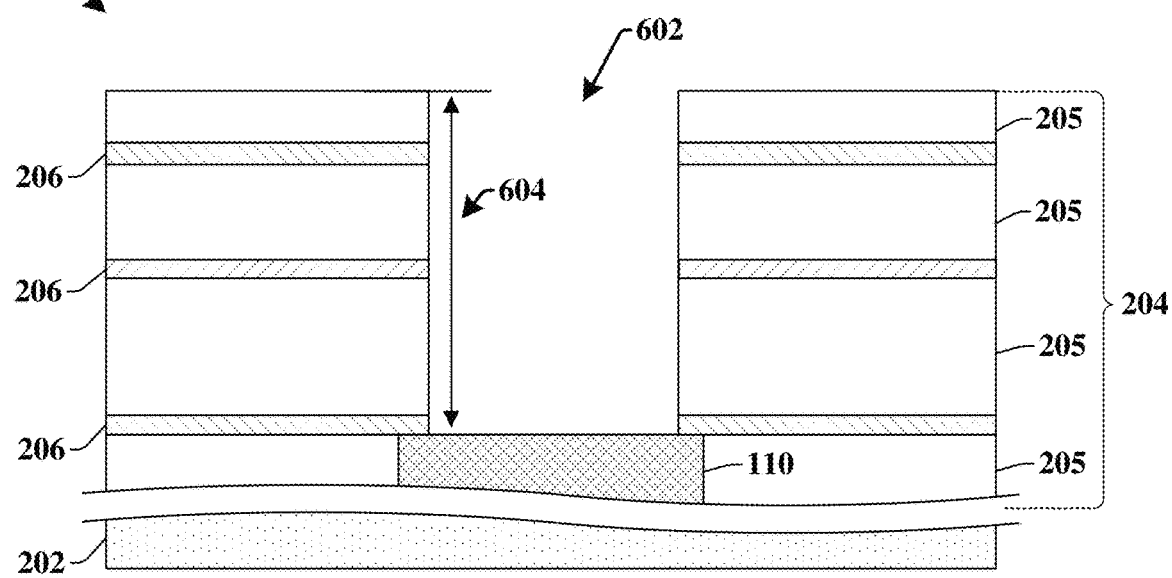

As shown in cross-sectional view 1700 of FIG. 17, an opening 602 is formed in the ILD structure 204. The opening 602 exposes the first electrode 110. In some embodiments, the opening 602 is formed with substantially vertical sidewalls. In other embodiments, the opening 602 is formed with angled sidewalls.

Figure 18:
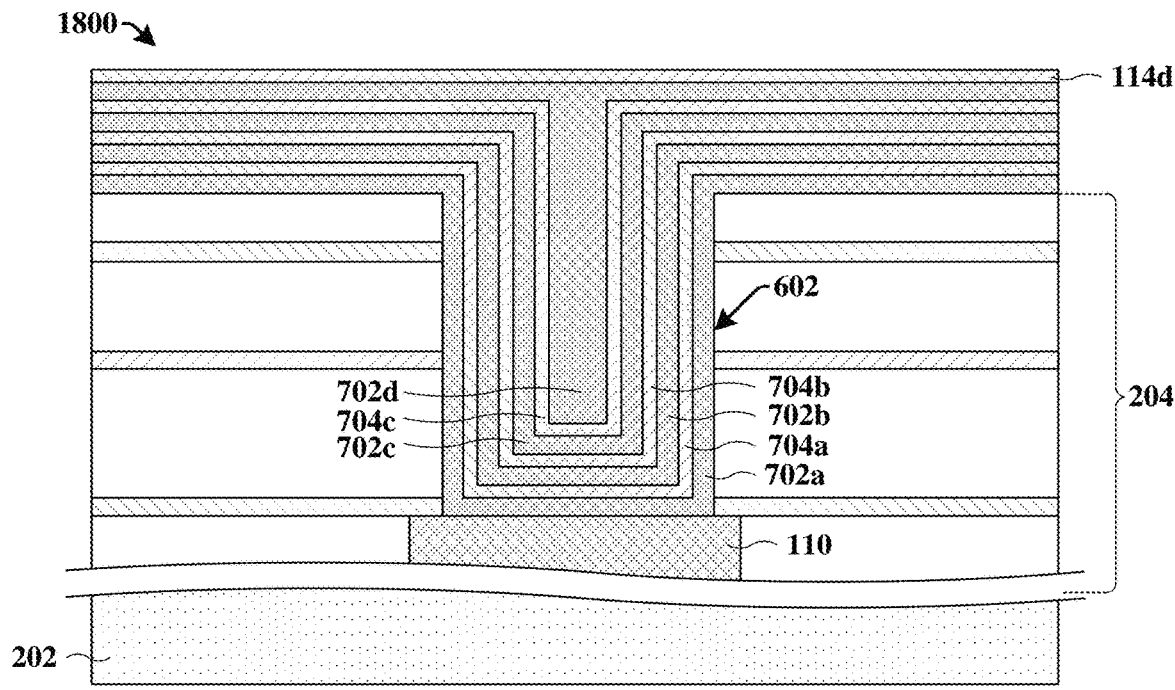

As shown in cross-sectional view 1800 of FIG. 18, a plurality of conformal conductive layers 702a-702d and a plurality of conformal insulator layers 704a-704d are formed in an alternating stack over the ILD structure 204 and lining the opening 602. The first conductive layer 702a is formed on the first electrode 110.

Figure 19:
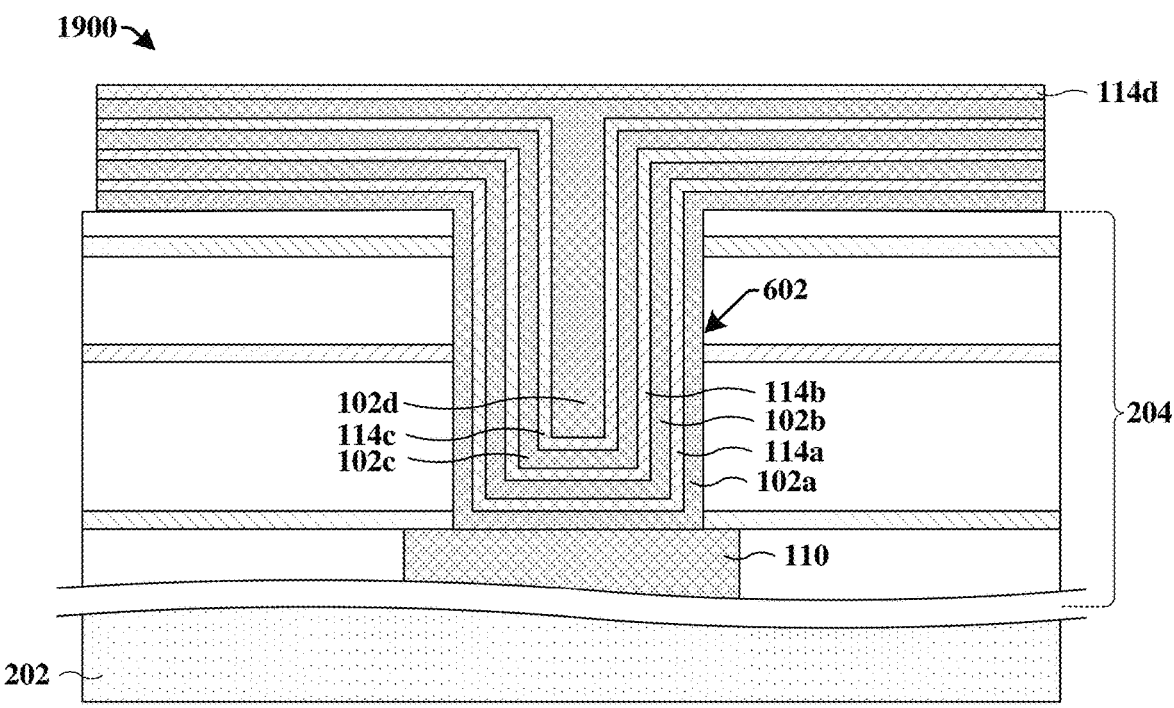

As shown in cross-sectional view 1900 of FIG. 19, the plurality of conductive plates 102a-102d and the plurality of capacitor insulator structures 114a-114d are formed over the ILD structure 204 and in the opening 602. The plurality of conductive plates 102a-102d and the plurality of capacitor insulator structures 114a-114d are formed by patterning the plurality of conformal conductive layers 702a-702d and the plurality of conformal insulator layers 704a-704d. Removing outer sections of the plurality of conformal conductive layers 702a-702d and the plurality of conformal insulator layers 704a-704d leaves the plurality of conductive plates 102a-102d and the plurality of capacitor insulator structures 114a-114d disposed over the ILD structure 204 and in the opening 602.

Figure 20:
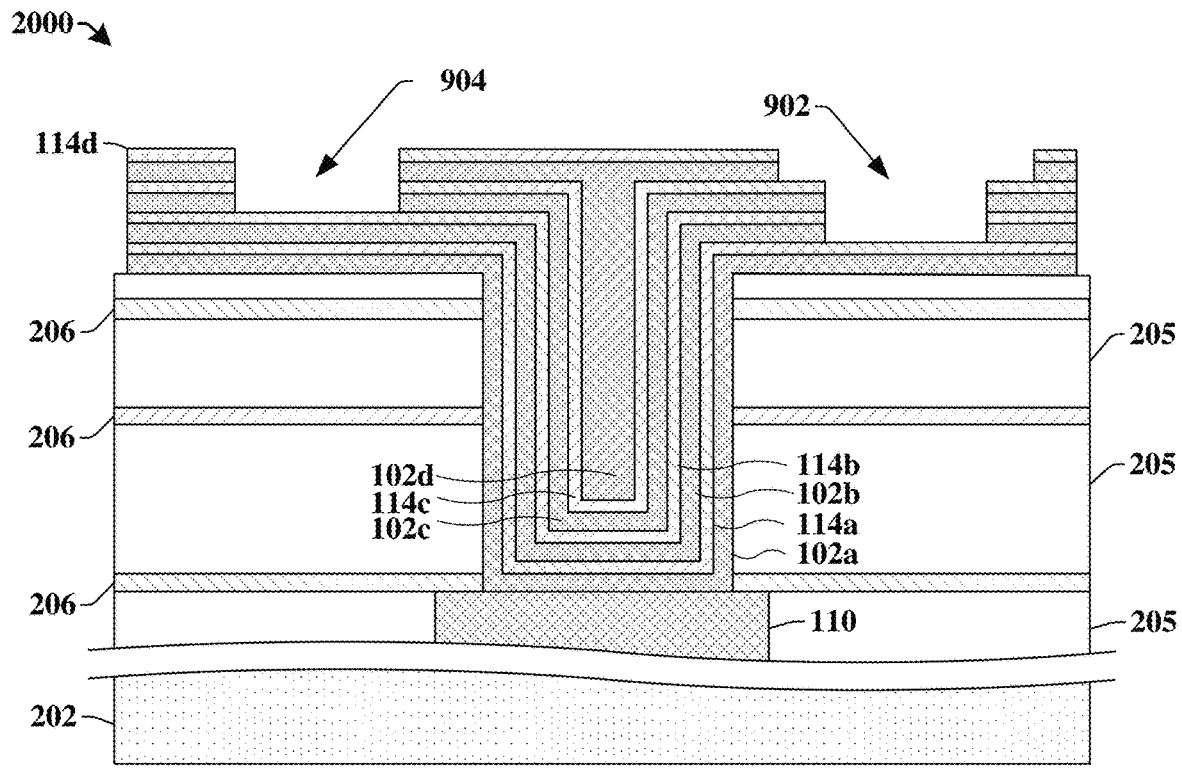

As shown in cross-sectional view 2000 of FIG. 20, a first tiered plug hole 902 and a second tiered plug hole 904 are formed through an uppermost surface of the alternating stack. The first tiered plug hole 902 and the second tiered plug hole 904 are formed using one or more etching processes (e.g., wet etching process, dry etching process, RIE process, etc.) to pattern the plurality of conductive plates 102a-102d and the plurality of capacitor insulator structures 114.

Figure 21:
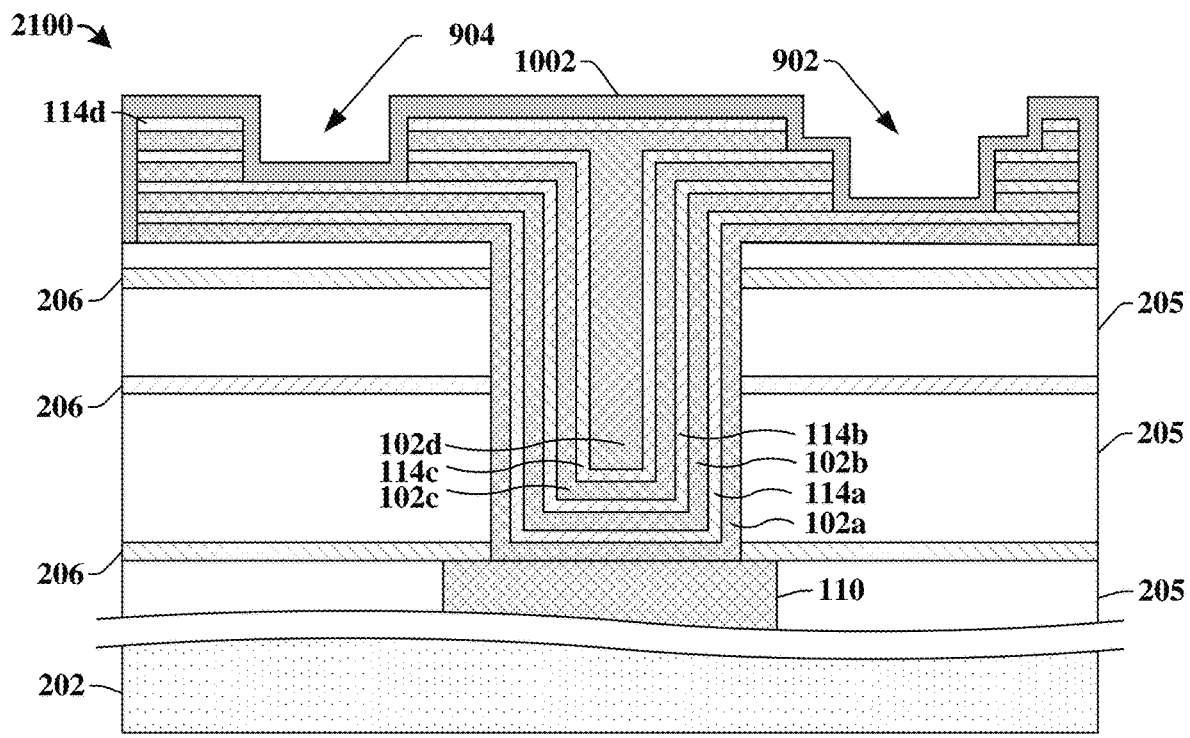

As shown in cross-sectional view 2100 of FIG. 21, an isolating material 1002 is formed over exposed surfaces of the alternating stack. The isolating material 1002 extends down outer sidewalls of the alternating stack, as well as into the first tiered plug hole 902 and second tiered plug hole 904.

Figure 22:
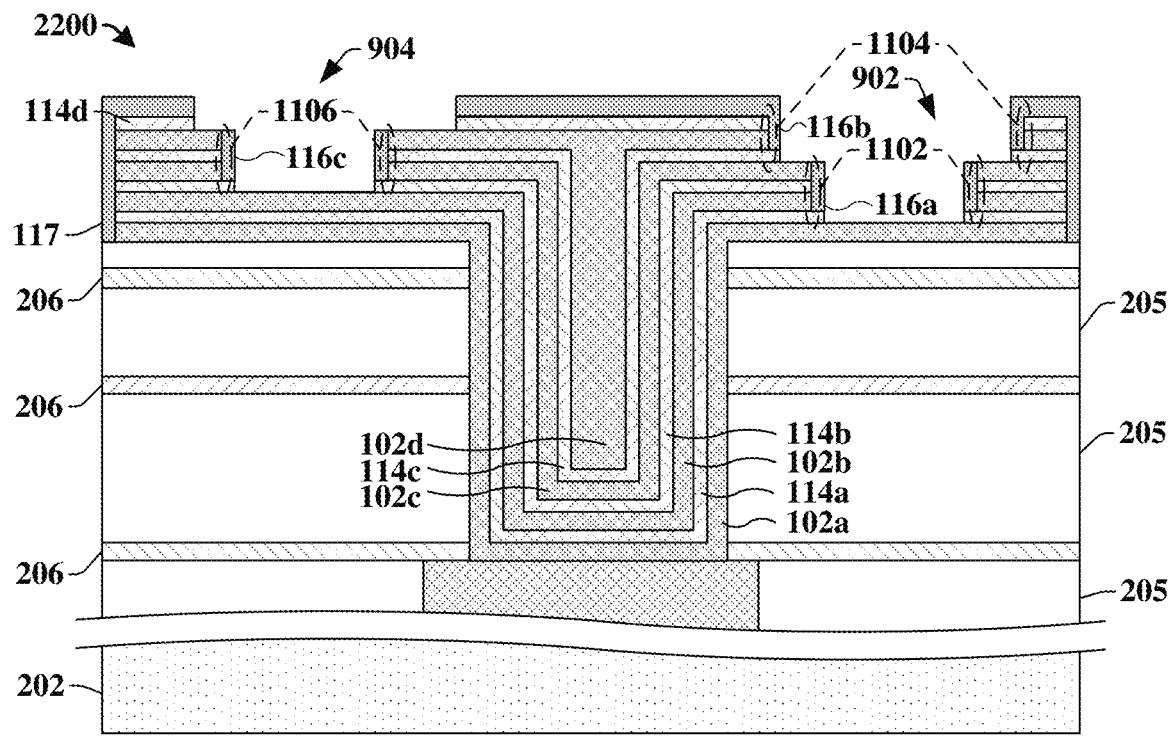

As shown in cross-sectional view 2200 of FIG. 22, the isolating material (1002 of FIG. 12) and portions of the plurality of capacitor insulator structures 114a-114d are partially removed. In some embodiments, the removal process comprises patterning the isolating material using a combination of a patterned masking layer (not shown) (e.g., positive/negative photoresist, a hardmask, etc.) and one or more etching processes (e.g., wet etching process, dry etching process, RIE process, etc.).

Figure 23:
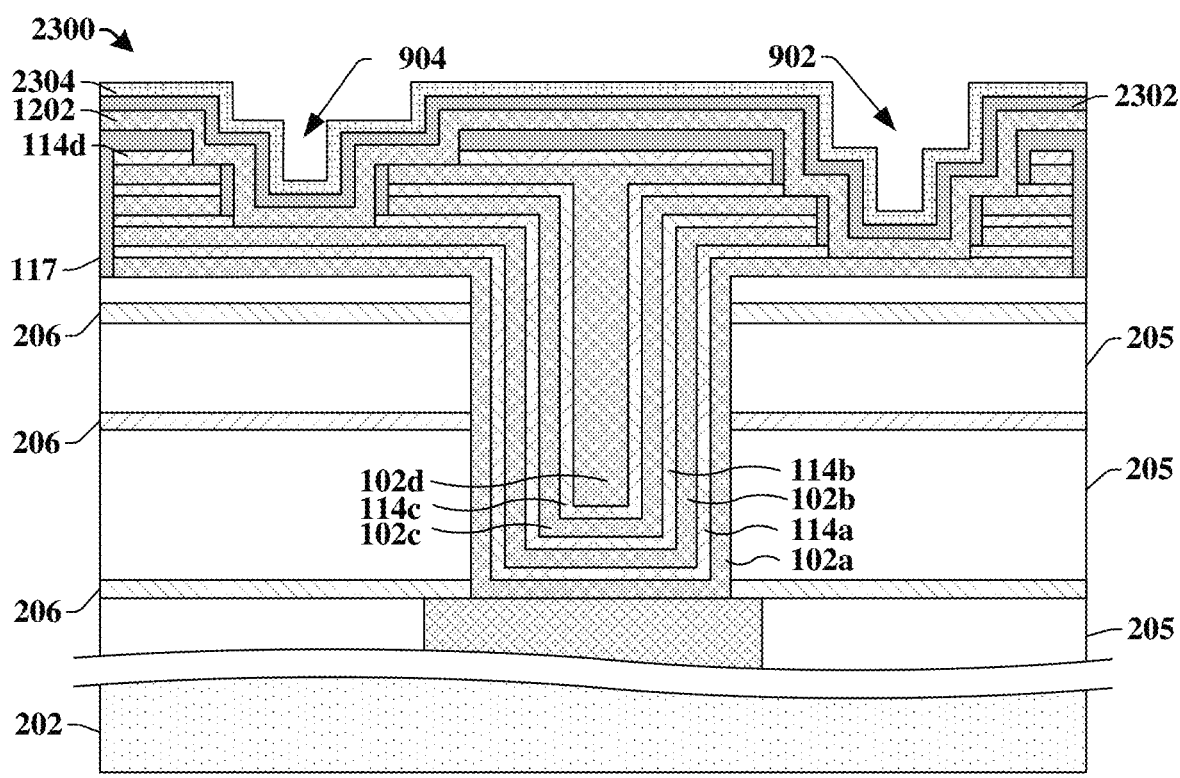

As shown in cross-sectional view 2300 of FIG. 23, a conductive layer 1202 is formed over the alternating stack. The conductive layer 1202 is formed by a deposition process (e.g., CVD, PVD, sputtering, etc.), a plating process (e.g., electrochemical plating, electroless plating, etc.), another suitable process, or a combination of foregoing. The conductive layer 1202 comprises, for example, copper (Cu), aluminum (Al), gold (Au), silver (Ag), some other conductive material, or a combination of the foregoing. The conductive layer 1202 is formed to line sidewalls within the first tiered plug hole 902 and second tiered plug hole 904. In some embodiments, the conductive layer 1202 lines sidewalls of the first tiered plug hole 902 and second tiered plug hole 904 without filling the first tiered plug hole 902 and second tiered plug hole 904 completely. The conductive layer 1202 conforms to the first tiered plug hole 902 and the second tiered plug hole 904, and has a plurality of upper surfaces that extend beneath the uppermost surface of the insulative segments 116a-116c.

Also shown in the cross-sectional view 2300 is the formation of a first conformal protection film 2302 and a second conformal protection film 2304 over the conductive layer 1202. The first conformal protection film 2302 covers and conforms to the conductive layer 1202. The second conformal protection film 2304 covers and conforms to the first conformal protection film 2302. In some embodiments, the second conformal protection film 2304 is not formed over the conductive layer 1202. The first conformal protection film 2302 and the second conformal protection film 2304 each comprise one of a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), USG, doped silicon dioxide (e.g., carbon doped silicon dioxide), BSG, PSG, BPSG, FSG, or other suitable materials. The first conformal protection film 2302 and the second conformal protection film 2304 are formed through CVD, PVD, ALD, some other deposition process, or a combination of the foregoing.

Figure 24:
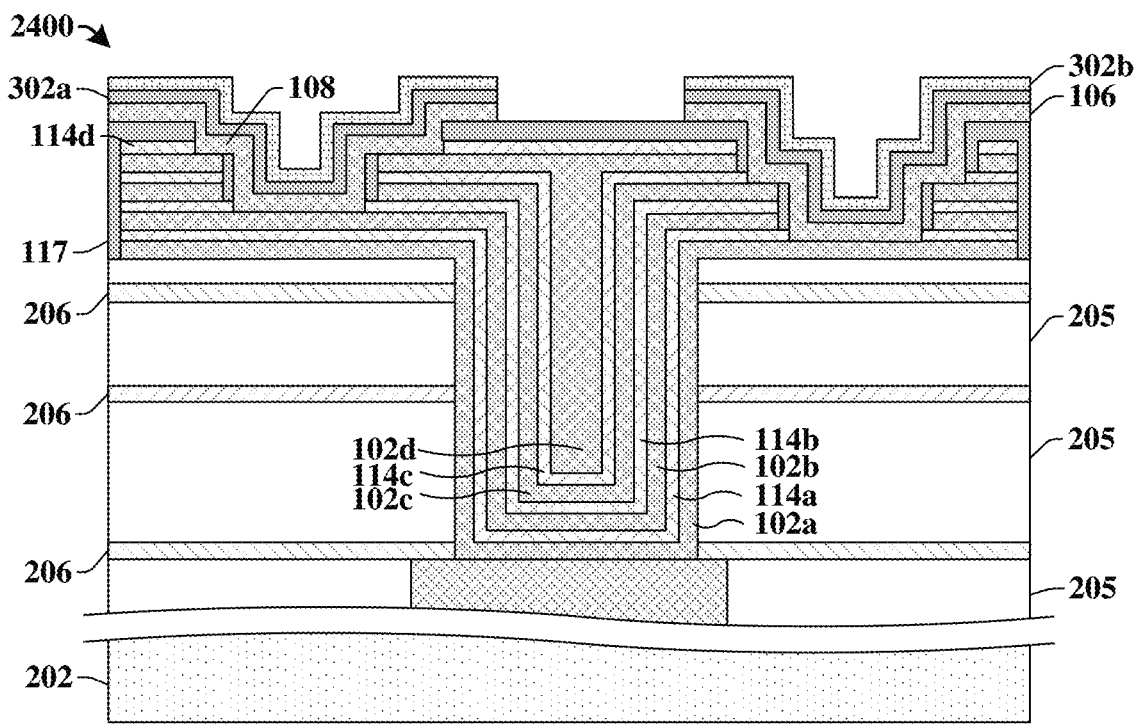

As shown in cross-sectional view 2400 of FIG. 24, a portion of the conductive layer (1202 of FIG. 23) is removed, and the remaining portions of the conductive layer 1202 form the first conductive plug structure 106 and second conductive plug structure 108. A portion of both the first conformal protection film 2302 and the second conformal protection film 2304 are also removed, and the remaining portions of the first conformal protection film 2302 and the second conformal protection film 2304 form the first protection films 302a and the second protection films 302b.

The removal process comprises forming a pattern masking layer (not shown) (e.g., positive/negative photoresist, a hardmask, etc.) on an upper surface of the second protection film 302b. With the patterned masking layer in place, one or more etching processes (e.g., wet etching process, dry etching process, RIE process, etc.) are performed on the first conformal protection film 2302, the second conformal protection film 2304, and the conductive layer 1202 according to the patterned masking layer, thereby forming the first conductive plug structure 106, the second conductive plug structure 108, the first protection films 302a, and the second protection films 302b. In some embodiments, the patterned masking layer is subsequently stripped away. In this embodiment, the first conductive plug structure 106 is isolated from the second conductive plug structure 108 by both the insulative segments and a gap between the uppermost portions of the first conductive plug structure 106 and the second conductive plug structure 108.

Figure 25:
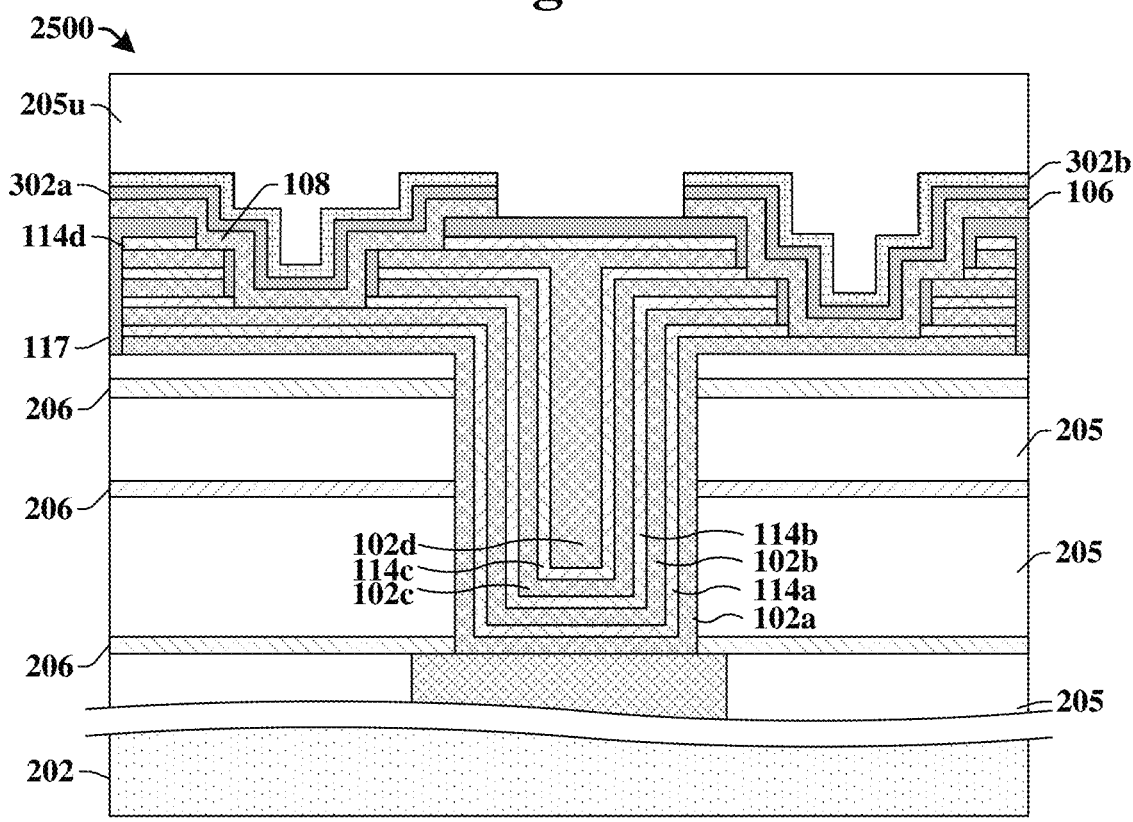

As shown in cross-sectional view 2500 of FIG. 25, the upper ILD layer 205u is formed over the first conductive plug structure 106 and the second conductive plug structure 108.

Figure 26:
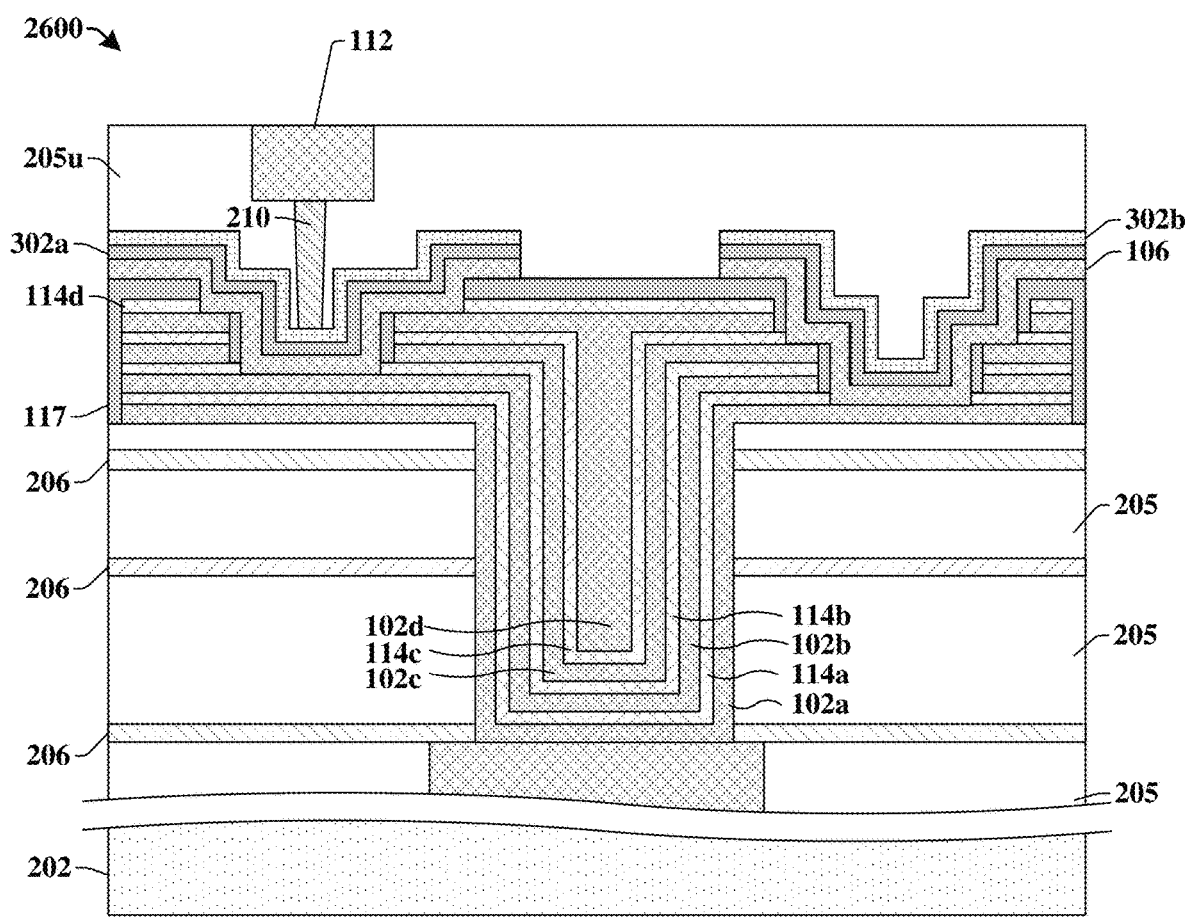

As shown in cross-sectional view 2600 of FIG. 26, the interconnect 210 and the second electrode 112 are formed within the stacked ILD layers 205. In some embodiments, the interconnect 210 extends to the lowest upper surface of the second conductive plug structure 108.

FIGS. 27-37 illustrate cross-sectional views of some embodiments of a method for forming an IC having a metal-insulator-metal MIM device with improved performance using greater than four conductive plates. Although FIGS. 27-37 are described with reference to a method, it will be appreciated that the structures shown in FIGS. 27-37 are not limited to the method but rather may stand alone separate of the method.

Figure 27:
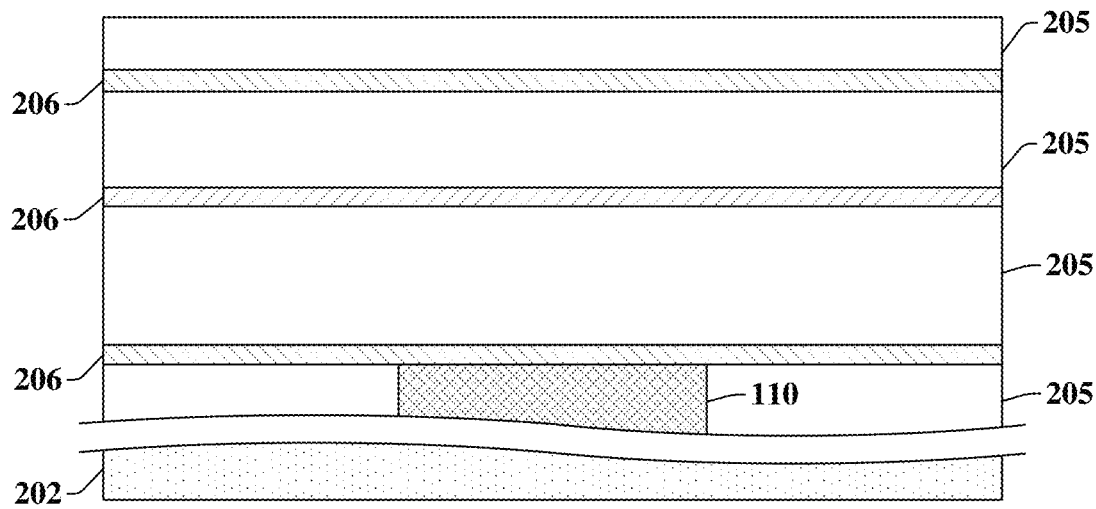
FIGS. 27-37 illustrate cross-sectional views of some embodiments of a method for forming an IC having a metal-insulator-metal MIM device with improved performance using greater than four conductive plates.

As shown in cross-sectional view 2700 of FIG. 27, a substrate 202 is provided, along with an ILD structure 204 comprising stacked ILD layers 205 and etch stop layers 206.

Figure 28:
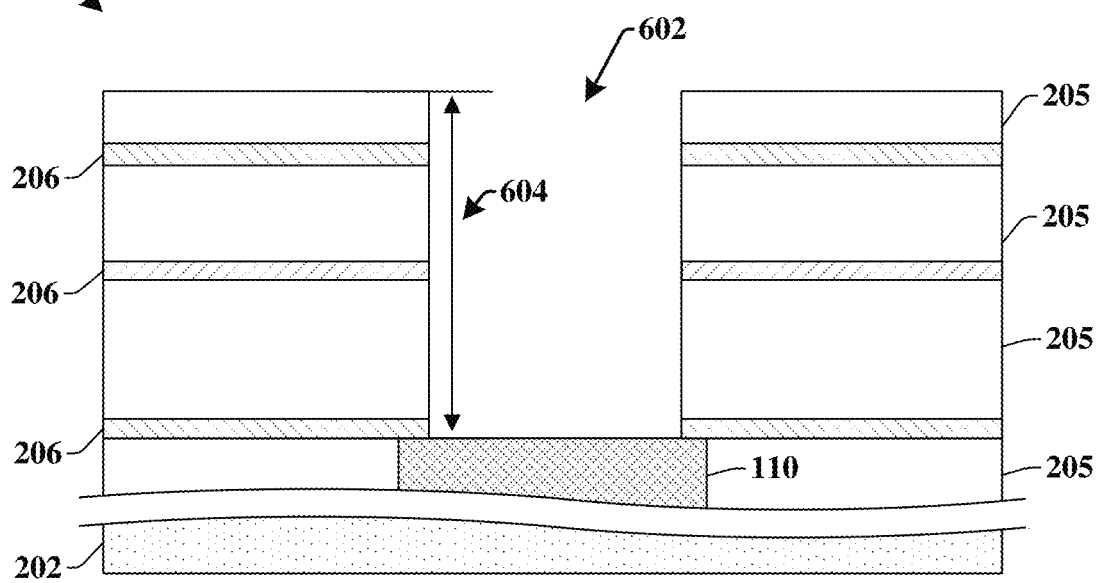

As shown in cross-sectional view 2800 of FIG. 28, an opening 602 is formed in the ILD structure 204. The opening 602 exposes the first electrode 110. In some embodiments, the opening 602 is formed with substantially vertical sidewalls. In other embodiments, the opening 602 is formed with angled sidewalls.

Figure 29:
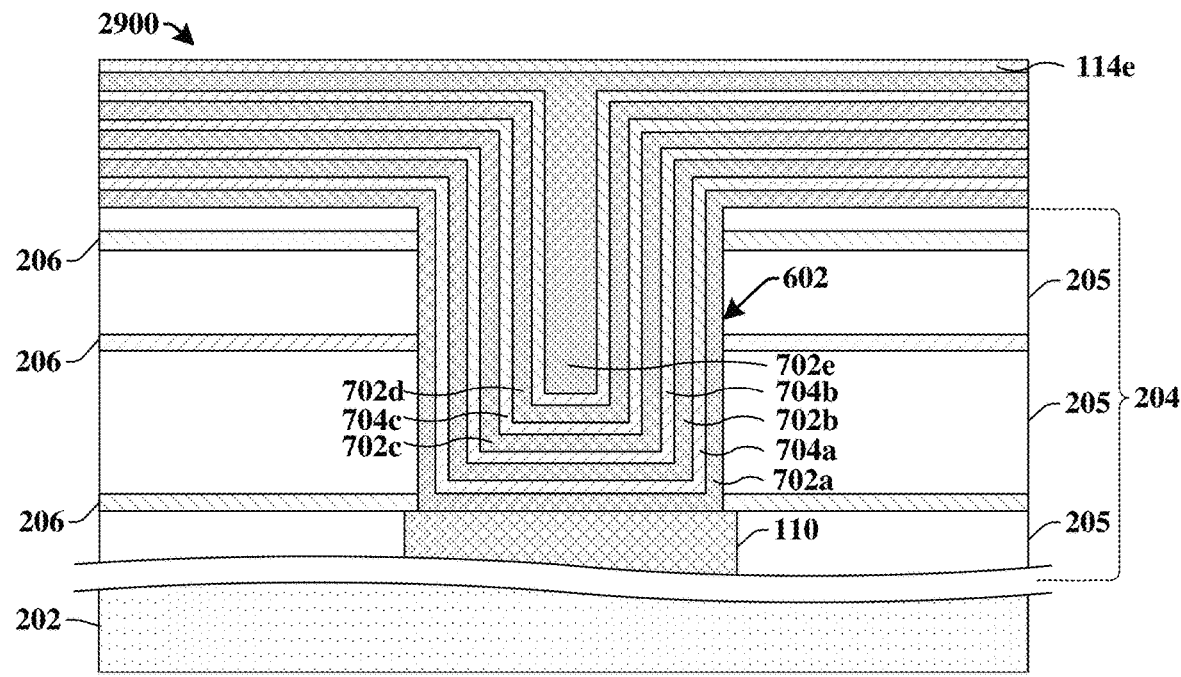

As shown in cross-sectional view 2900 of FIG. 29, a plurality of conformal conductive layers 702a-702e and a plurality of conformal insulator layers 704a-704e are formed in an alternating stack over the ILD structure 204 and lining the opening 602. The first conductive layer 702a is formed on the first electrode 110. In some embodiments, the plurality of conformal conductive layers 702a-702e and the plurality of conformal insulator layers 704a-704e are numbered greater than four. In this example, there are five conformal conductive layers 702a-702e and five conformal insulator layers 704a-704e.

Figure 30:
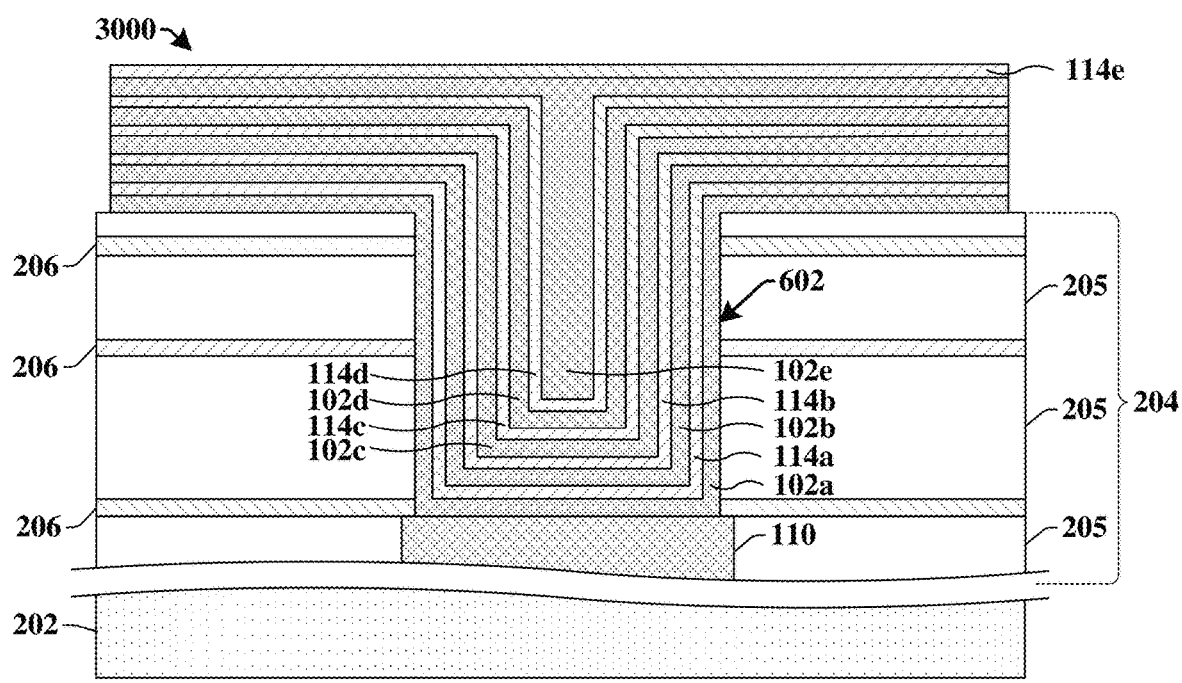

As shown in cross-sectional view 3000 of FIG. 30, the plurality of conductive plates 102a-102e and the plurality of capacitor insulator structures 114a-114e are formed over the ILD structure 204 and in the opening 602. The plurality of conductive plates 102a-102e and the plurality of capacitor insulator structures 114a-114e are formed by patterning the plurality of conformal conductive layers 702a-702e and the plurality of conformal insulator layers 704a-704e. Removing outer sections of the plurality of conformal conductive layers 702a-702e and the plurality of conformal insulator layers 704a-704e leaves the plurality of conductive plates 102a-102e and the plurality of capacitor insulator structures 114a-114e disposed over the ILD structure 204 and in the opening 602.

Figure 31:
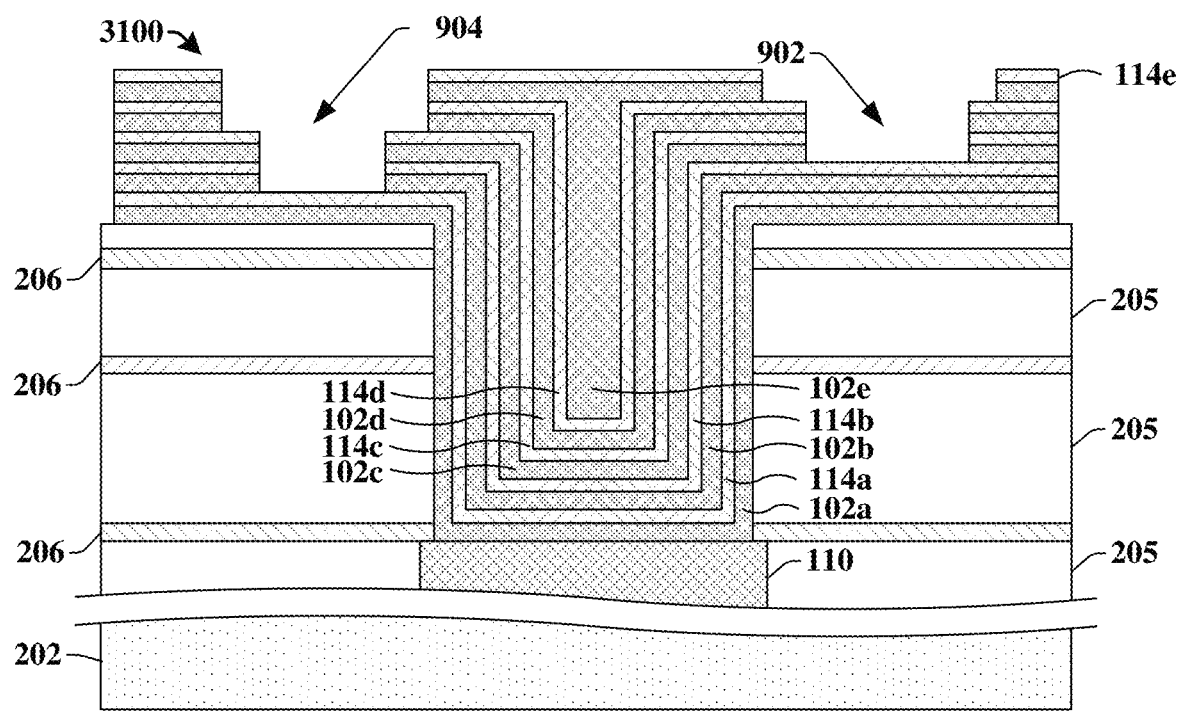

As shown in cross-sectional view 3100 of FIG. 31, a first tiered plug hole 902 and a second tiered plug hole 904 are formed through an uppermost surface of the alternating stack. The first tiered plug hole 902 and the second tiered plug hole 904 are formed using one or more etching processes (e.g., wet etching process, dry etching process, RIE process, etc.) to pattern the plurality of conductive plates 102a-102e and the plurality of capacitor insulator structures 114. In this example, the first tiered plug hole 902 has two tiers and the second tiered plug hole 904 has two tiers, due to there being five conductive plates 102a-102e in the alternating stack.

Figure 32:
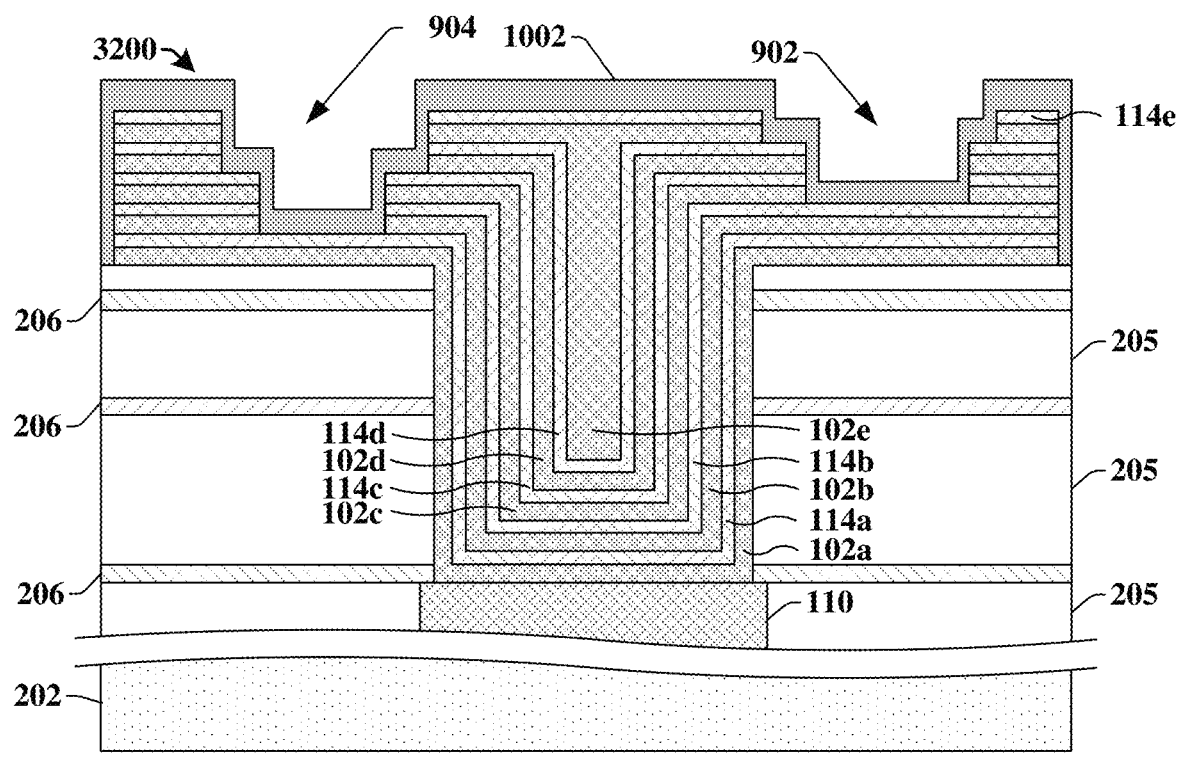

As shown in cross-sectional view 3200 of FIG. 32, an isolating material 1002 is formed over exposed surfaces of the alternating stack. The isolating material 1002 extends down outer sidewalls of the alternating stack, as well as into the first tiered plug hole 902 and second tiered plug hole 904.

Figure 33:
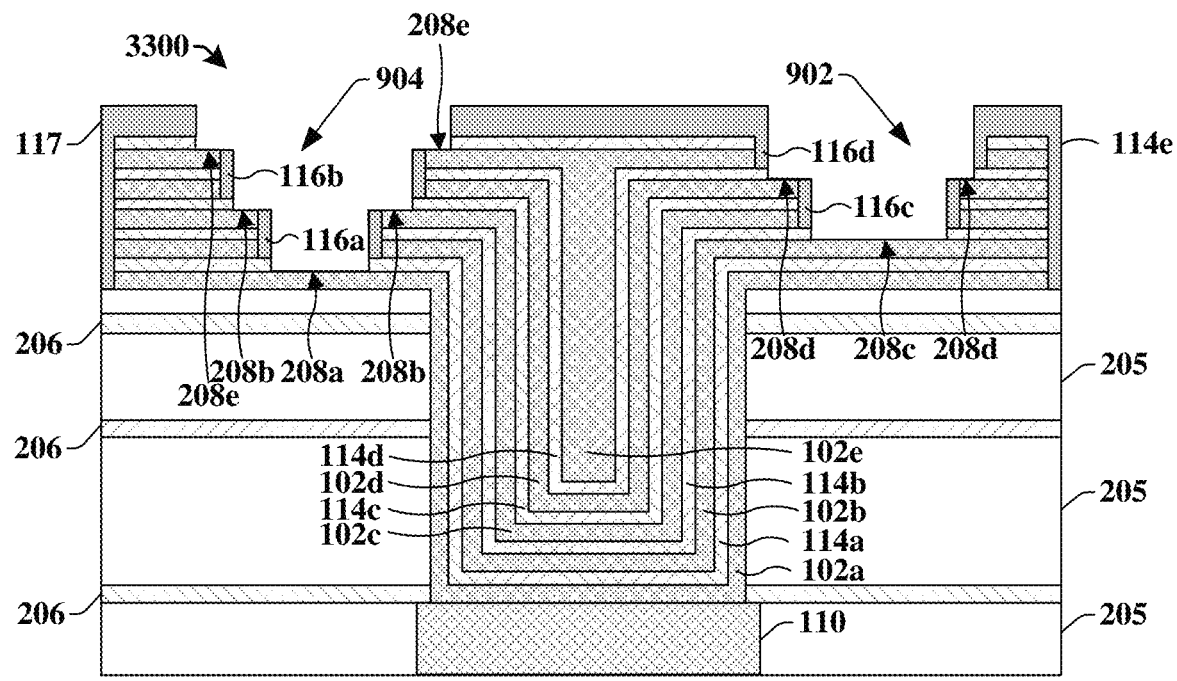

As shown in cross-sectional view 3300 of FIG. 33, the isolating material (1002 of FIG. 32) and portions of the plurality of capacitor insulator structures 114a-114e are partially removed. In some embodiments, the removal process comprises patterning the isolating material using a combination of a patterned masking layer (not shown) (e.g., positive/negative photoresist, a hardmask, etc.) and one or more etching processes (e.g., wet etching process, dry etching process, RIE process, etc.). This partial removal forms the insulative segments 116a-116d, including the first insulative segments 116a, the second insulative segments 116b, the third insulative segments 116c, and the fourth insulative segments 116d. The fourth insulative segments 116d isolate the fifth conductive plate 102e from the first tiered plug hole 902. The insulative barrier 117 further isolates the conductive plates 102a-102e on one edge of the alternating stack.

Figure 34:
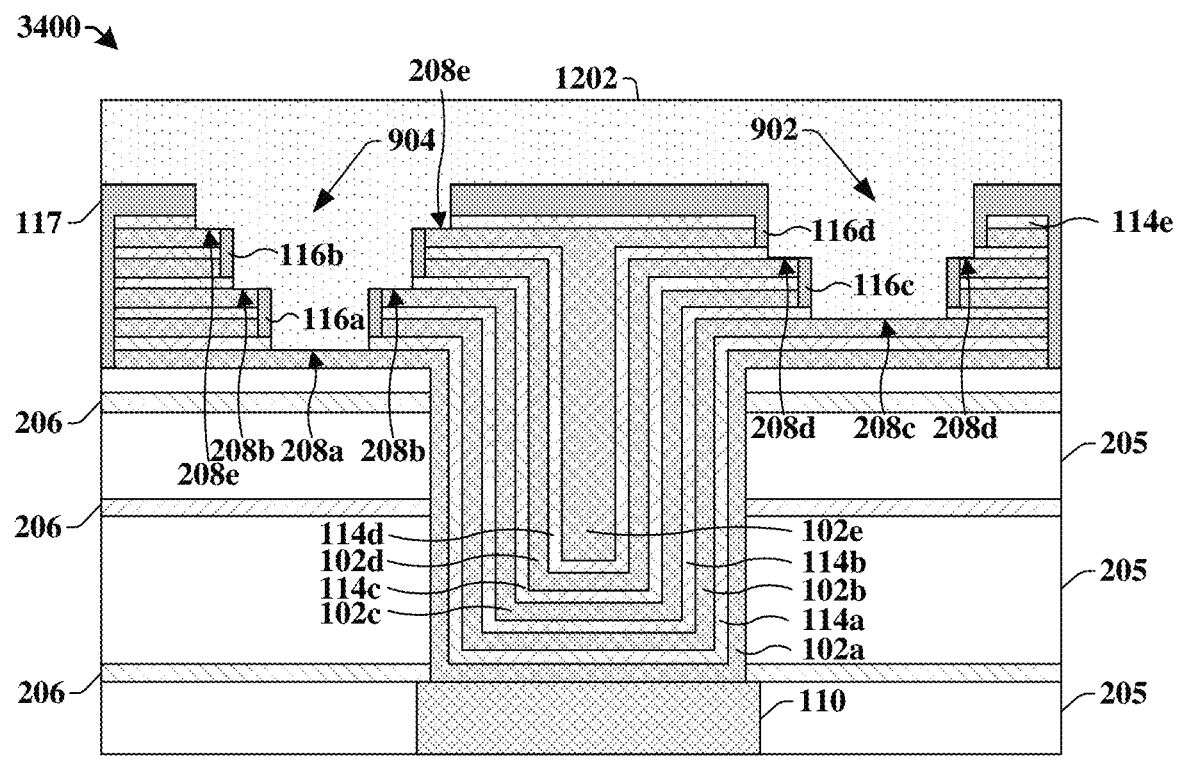

As shown in cross-sectional view 3400 of FIG. 34, a conductive layer 1202 is formed over the alternating stack. The conductive layer 1202 is formed by a deposition process (e.g., CVD, PVD, sputtering, etc.), a plating process (e.g., electrochemical plating, electroless plating, etc.), another suitable process, or a combination of foregoing. The first conductive layer comprises, for example, copper (Cu), aluminum (Al), gold (Au), silver (Ag), some other conductive material, or a combination of the foregoing. The conductive layer 1202 is formed to line sidewalls within the first tiered plug hole 902 and second tiered plug hole 904. In some embodiments, the conductive layer 1202 fills the first tiered plug hole 902 and second tiered plug hole 904 completely, and has an uppermost surface covering the alternating stack. In some embodiments, the conductive layer 1202 lines the uppermost surface of the insulative segments 116a-116d.

Figure 35:
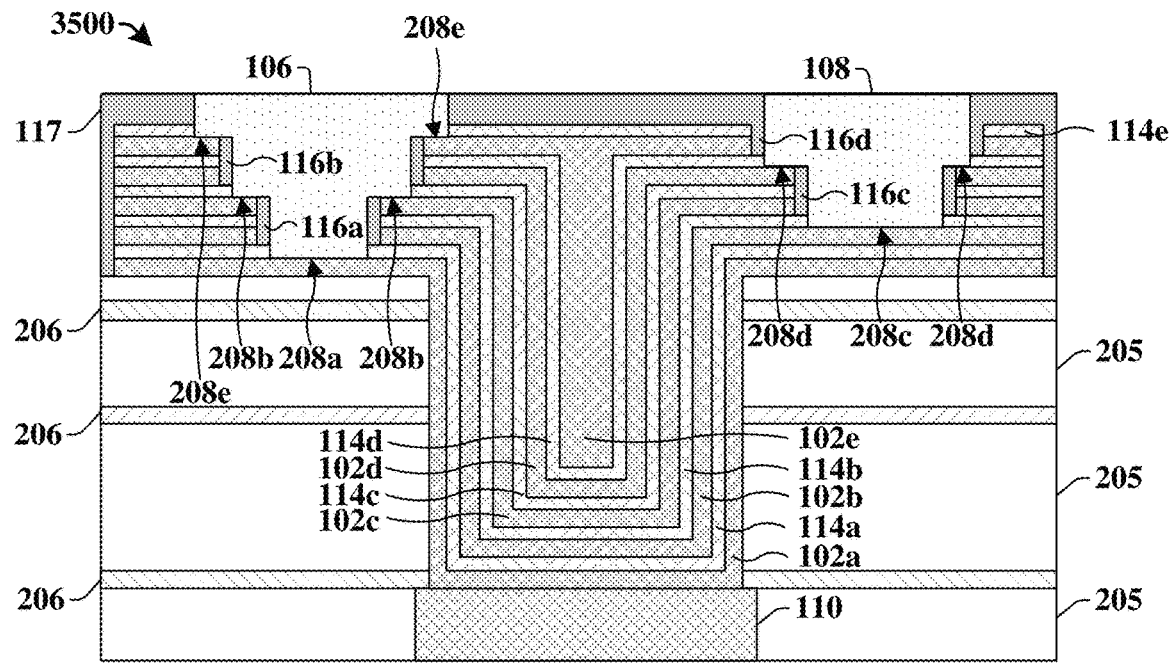

As shown in cross-sectional view 3500 of FIG. 35, a portion of the conductive layer (1202 of FIG. 34) is removed, and the remaining portions of the conductive layer 1202 form the first conductive plug structure 106 and second conductive plug structure 108.

In some embodiments, the portion of the conductive layer 1202 is removed through a planarization process (e.g., chemical mechanical polishing (CMP) process), wherein the conductive layer 1202 is removed down to the uppermost surface of the insulative segments 116a-116d. In this case, the upper surfaces of the first conductive plug structure 106, the second conductive plug structure 108, and the insulative segments 116a-116d are planarized, and the first conductive plug structure 106 is isolated from the second conductive plug structure 108 by the insulative segments 116a-116d.

Figure 36:
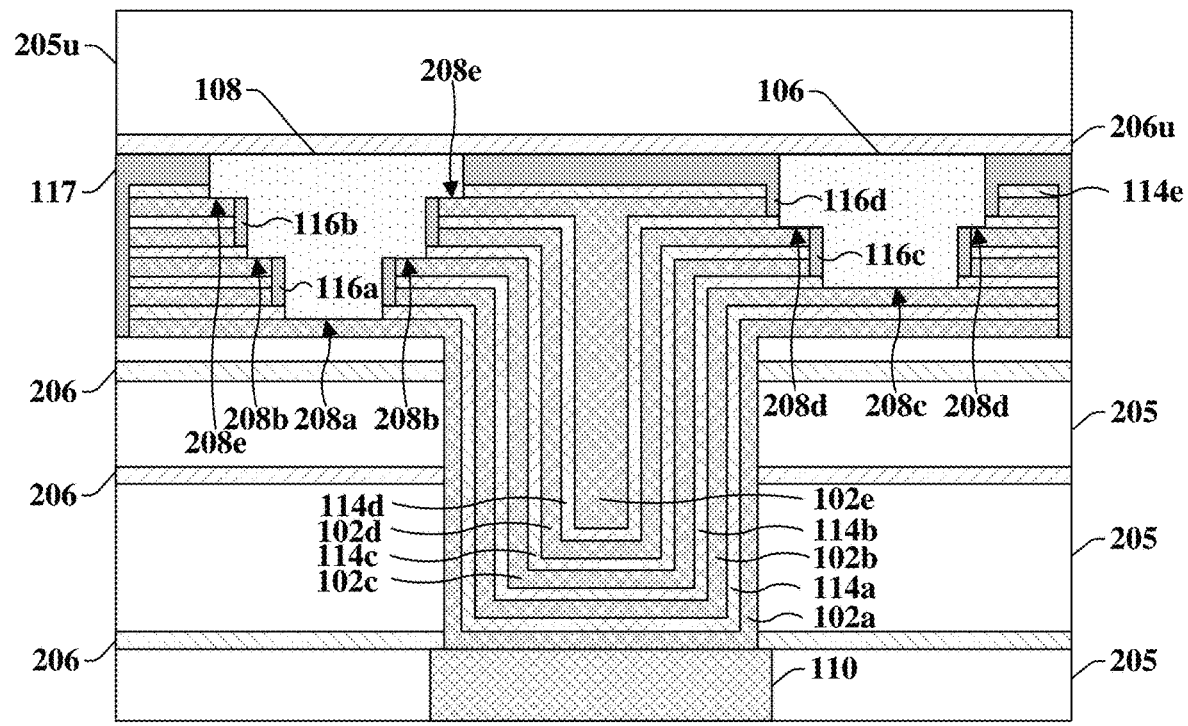

As shown in cross-sectional view 3600 of FIG. 36, upper ILD layer 205u and etch stop layer 206u are formed over the first conductive plug structure 106 and the second conductive plug structure 108.

Figure 37:
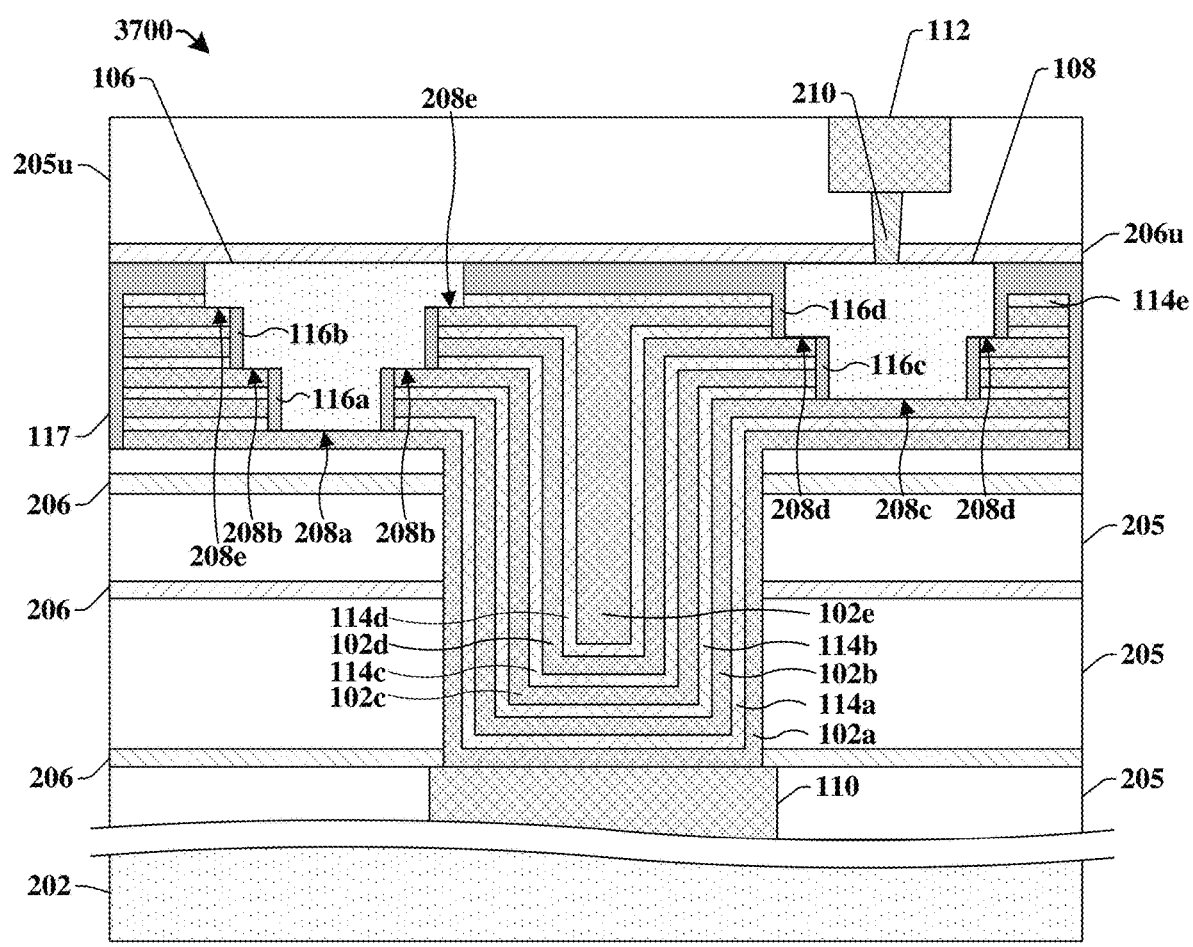

As shown in cross-sectional view 3700 of FIG. 37, the interconnect 210 and the second electrode 112 are formed within the stacked ILD layers 205. In some embodiments, the interconnect 210 extends to the lowest upper surface of the second conductive plug structure 108.

Figure 38:
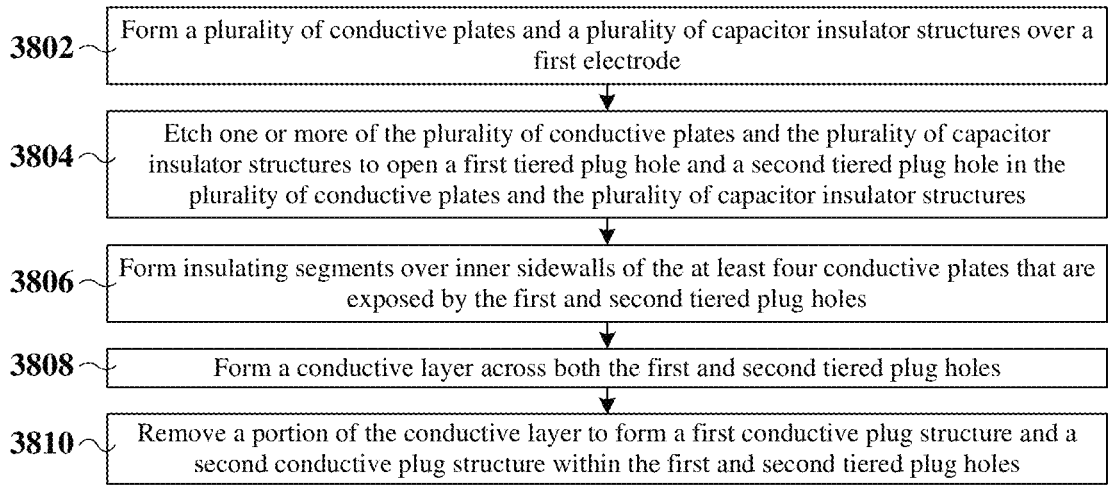
FIG. 38 illustrates a methodology in flowchart format of some additional embodiments of a method of forming an integrated chip structure having a MIM device with a plurality of conductive plates and conductive plug structures selectively coupled to the plurality of conductive plates.

FIG. 38 illustrates a flowchart 3800 of some embodiments of a method for forming an IC having a metal-insulator-metal MIM device with improved performance. While the flowchart 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 3802, a plurality of conductive plates and a plurality of capacitor insulator structures are formed over a first electrode. FIGS. 5-8, 16-19, and 27-30 illustrate a series of cross-sectional views 500-800, 1600-1900, and 2700-3000 of some embodiments corresponding to act 3802.

At act 3804, one or more of the plurality of conductive plates and the plurality of capacitor insulator structures are etched to form a first tiered plug hole and a second tiered plug hole extending into the plurality of conductive plates and the plurality of capacitor insulator structures. FIGS. 9, 20, and 31 illustrate a cross-sectional view 900, 2000, and 3100 of some embodiments corresponding to act 3804.

At act 3806, insulating segments are formed over inner sidewalls of the plurality of conductive plates that are exposed by the first and second tiered plug holes. FIGS. 10-11, 21-22, and 32-33 illustrate a series of cross-sectional views 1000-1100, 2100-2200, and 3200-3300 of some embodiments corresponding to act 3806.

At act 3808, a conductive layer is formed across both the first and second tiered plug holes. FIGS. 12, 23, and 34 illustrate a cross-sectional view 1200, 2300, and 3400 of some embodiments corresponding to act 3808.

At act 3810, a portion of the conductive layer is removed to form a first conductive plug structure and a second conductive plug structure within the first and second tiered plug holes. FIGS. 13, 24, and 35 illustrate a cross-sectional view 1300, 2400, and 3500 of some embodiments corresponding to act 3810.

In some embodiments, the present application provides an integrated chip (IC) including a metal-insulator-metal (MIM) device. The IC comprises a plurality of conductive plates that are disposed over a substrate and separated from one another by a plurality of capacitor insulator structures. The IC further comprises a first conductive plug structure that has lower surfaces contacting a first conductive plate and to a third conductive plate of the plurality of conductive plates. A first plurality of insulative segments are arranged along sidewalls of the first conductive plug structure and laterally separate the sidewalls of the first conductive plug structure from a second conductive plate and a fourth conductive plate of the plurality of conductive plates. The IC further comprises a second conductive plug structure that has lower surfaces contacting the second conductive plate and to the fourth conductive plate of the plurality of conductive plates. A second plurality of insulative segments are arranged along sidewalls of the second conductive plug structure and laterally separate the sidewalls of the second conductive plug structure from the third conductive plate.

In some embodiments, the present application provides an integrated chip (IC) including a metal-insulator-metal (MIM) device. The IC comprises a plurality of conductive plates that are spaced from one another. The IC also comprises a plurality of capacitor insulator structures, wherein each of the plurality of capacitor insulator structures are disposed between and electrically isolate neighboring conductive plates of the plurality of conductive plates. The IC further comprises a first conductive plug structure that is electrically coupled to a first conductive plate and to a third conductive plate of the plurality of conductive plates. A first face of the first conductive plug structure is coupled to the first conductive plate, and is laterally surrounded by a second face of the first conductive plug structure that is coupled to the third conductive plate. The MIM device further comprises a second conductive plug structure that is electrically coupled to the second conductive plate and to the fourth conductive plate of the plurality of conductive plates. A first face of the second conductive plug structure is coupled to the second conductive plate and is laterally surrounded by a second face of the second conductive plug structure that is coupled to the fourth conductive plate.

In some embodiments, the present application provides a method for forming an integrated chip. The method comprises forming a plurality of conductive plates and a plurality of capacitor insulator structures over a first electrode. A first tiered plug hole and a second tiered plug hole is opened in the plurality of conductive plates and the plurality of capacitor insulator structures. Insulating segments are formed over inner sidewalls of the plurality of conductive plates that are exposed within the first and second tiered plug holes. A conductive layer is formed across both the first and second tiered plug holes. A portion of the conductive layer is removed to form a first conductive plug structure and a second conductive plug structure.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip (IC), comprising:
   forming a plurality of conductive plates and a plurality of capacitor insulator structures over a first electrode;
   etching one or more of the plurality of conductive plates and the plurality of capacitor insulator structures to open a first tiered plug hole and a second tiered plug hole in the plurality of conductive plates and the plurality of capacitor insulator structures;
   forming insulating segments over inner sidewalls of the plurality of conductive plates that are exposed by the first and second tiered plug holes;
   forming a conductive layer across both the first and second tiered plug holes; and
   removing a portion of the conductive layer to form a first conductive plug structure and a second conductive plug structure within the first and second tiered plug holes.

2. The method of claim 1, wherein the plurality of conductive plates and the plurality of capacitor insulator structures form a "T" shape, with a bottom of the "T" shape coupled to the first electrode.

3. The method of claim 1, wherein the first tiered plug hole comprises a first inner sidewall and a second inner sidewall, wherein the second tiered plug hole comprises a third inner sidewall, and wherein the first inner sidewall and the second inner sidewall are nested.

4. The method of claim 1, where forming the insulating segments over the inner sidewalls further comprises:
   depositing isolating material over the first and second tiered plug holes, covering inner sidewalls of the first and second tiered plug holes;
   forming a mask over a portion of upper surfaces of the isolating material; and
   removing an exposed section of the isolating material, leaving the insulating segments both covering the inner sidewalls and directly over a portion of an uppermost conductive plate of the plurality of conductive plates.

5. The method of claim 1, wherein the portion of the conductive layer is removed using a planarization process, and wherein the planarization process results in the first conductive plug structure and the second conductive plug structure remaining in the first tiered plug hole and the second tiered plug hole, respectively.

6. The method of claim 1, further comprising:
   lining both an uppermost surface of the insulating segments and the first and second tiered plug holes with the conductive layer;
   lining the conductive layer with a protection film; and
   removing a portion of the conductive layer and the protection film by forming a mask over the first tiered plug hole and the second tiered plug hole, and etching the portion of the conductive layer and the protection film between the first tiered plug hole and the second tiered plug hole.

7. A method of forming an integrated device, comprising:
   forming a plurality of conformal conductive layers and a plurality of conformal insulator layers over a first electrode;
   performing a first plurality of etching processes to remove portions of the conformal conductive layers and plurality of conformal insulator layers, resulting in a plurality of conductive plates and a plurality of capacitor insulator structures;
   performing a second plurality of etching processes to form a first tiered plug hole having a first plurality of inner sidewalls and a second tiered plug hole having a second plurality of inner sidewalls;
   forming insulative segments covering exposed surfaces of the first plurality of inner sidewalls and the second plurality of inner sidewalls; and
   forming a first conductive plug and a second conductive plug, the first conductive plug being electrically coupled to a first portion of the plurality of conductive plates in the first tiered plug hole and the second conductive plug being electrically coupled to a second portion of the plurality of conductive plates in the second tiered plug hole.

8. The method of claim 7, wherein the first portion of the plurality of conductive plates comprises even numbered plates of the plurality of conductive plates and the second portion of conductive plates comprises odd numbered plates of the plurality of conductive plates, such that plates of the first portion alternate with plates of the second portion across a height of the first conductive plug.

9. The method of claim 7, wherein forming the insulative segments further comprises:
   depositing isolating material over the first and second tiered plug holes, covering the inner sidewalls of the first and second tiered plug holes;
   forming a mask over a portion of upper surfaces of the isolating material; and
   removing an exposed section of the isolating material, leaving the insulating segments both covering the inner sidewalls and directly over a portion of an uppermost conductive plate of the plurality of conductive plates.

10. The method of claim 9, wherein the isolating material comprises a first upper portion extending over the plurality of conductive plates and the plurality of capacitor insulator structures; and
    wherein the first upper portion of the isolating material remains after the insulative segments are formed.

11. The method of claim 10, wherein forming the first conductive plug and the second conductive plug further comprises:
    filling the first and second tiered plug holes with a conductive layer, the conductive layer extending over the first upper portion; and
    removing a portion of the conductive layer above the first upper portion of the isolating material.

12. The method of claim 7, wherein the first conductive plug extends directly over an uppermost conductive plate of the plurality of conductive plates, and wherein the second conductive plug is laterally spaced from the uppermost conductive plate of the plurality of conductive plates by the insulative segments.

13. The method of claim 7, wherein the first conductive plug extends to a first depth beneath an uppermost conductive plate of the plurality of conductive plates, the second conductive plug extends to a second depth beneath the uppermost conductive plate, and the first depth is greater than the second depth.

14. The method of claim 7, wherein the first conductive plug has a greater number of lower surfaces than the second conductive plug.

15. A method of forming an integrated device, comprising:
    forming a plurality of conductive plates and a plurality of capacitor insulator structures over a substrate;
    etching a first tiered plug hole and a second tiered plug hole into the plurality of conductive plates and the plurality of capacitor insulator structures, the first tiered plug hole exposing a total number of conductive plates and having a first number of tiers equal to half of the total number of conductive plates rounded down, and the second tiered plug hole exposing one less than the total number of conductive plates and having a second number of tiers equal to half of one less than the total number of conductive plates, rounded down;
    forming insulative segments along inner sidewalls of the first tiered plug hole and the second tiered plug hole, the insulative segments covering a number of conductive plates equal to the first number of tiers in the first tiered plug hole and covering a number of conductive plates equal to the second number of tiers in the second tiered plug hole; and
    forming a first conductive plug in the first tiered plug hole and a second conductive plug in the second tiered plug hole, wherein the first conductive plug is coupled to a first portion of the plurality of conductive plates and the second conductive plug is coupled to a second portion of the plurality of conductive plates.

16. The method of claim 15, wherein after the first conductive plug and the second conductive plug are formed, the insulative segments separate the first conductive plug from conductive plates in the second portion of the plurality of conductive plates, and the first conductive plug separates the second conductive plug from conductive plates in the first portion of the plurality of conductive plates.

17. The method of claim 15, wherein forming the insulative segments comprises:

forming an isolating material over the first tiered plug hole and the second tiered plug hole;

forming a first masking layer over portions of the isolating material; and patterning the isolating material according to the first masking layer, resulting in a removal of portions of the isolating material covering upper surfaces of the plurality of conductive plates and resulting in the insulative segments remaining on inner sidewalls of the conductive plates.

18. The method of claim 17, wherein an insulative segment in the first tiered plug hole extends from a first inner sidewall of a first conductive plate to a second inner sidewall of a second conductive plate.

19. The method of claim 18, wherein an insulative segment in the second tiered plug hole extends from a third inner sidewall of the second conductive plate to a fourth inner sidewall of a third conductive plate.

20. The method of claim 17, wherein an upper portion of the isolating material is covered by the first masking layer and remains on the plurality of conductive plates after the patterning of the isolated material; and wherein the first and second conductive plugs extend over the upper portion of the isolating material.

* * * * *